(12) United States Patent
Roberts et al.

(10) Patent No.: US 7,068,269 B2
(45) Date of Patent: Jun. 27, 2006

(54) SYSTEM AND METHOD FOR PRESENTING THREE-DIMENSIONAL DATA

(76) Inventors: Brian Curtis Roberts, 5301 Quail Creek Dr., McKinney, TX (US) 75070; Chad William Mueller, 1518 Leeward La., Wylie, TX (US) 75098

( * ) Notice: Subject to any disclaimer, the term of this patent is extended or adjusted under 35 U.S.C. 154(b) by 384 days.

(21) Appl. No.: 10/231,545

(22) Filed: Aug. 30, 2002

(65) Prior Publication Data
US 2004/0041812 A1 Mar. 4, 2004

(51) Int. Cl.
*G06T 15/00* (2006.01)
(52) U.S. Cl. ........................ 345/419; 345/473
(58) Field of Classification Search ................ 345/419, 345/473, 474, 475, 427, 428
See application file for complete search history.

(56) References Cited

U.S. PATENT DOCUMENTS

| 5,572,634 | A | | 11/1996 | Duluk, Jr. ................ 395/119 |
| 5,767,855 | A | * | 6/1998 | Bardon et al. ............ 345/848 |
| 5,808,613 | A | * | 9/1998 | Marrin et al. ............ 345/850 |
| 5,812,138 | A | | 9/1998 | Devic ....................... 345/422 |
| 5,815,154 | A | | 9/1998 | Hirschtick et al. ....... 345/356 |
| 5,882,206 | A | | 3/1999 | Gillio ........................ 434/262 |
| 5,883,628 | A | | 3/1999 | Mullaly et al. ........... 345/355 |
| 5,923,324 | A | * | 7/1999 | Berry et al. ............... 345/852 |
| 6,028,609 | A | * | 2/2000 | Kawakami ................ 345/474 |
| 6,050,896 | A | | 4/2000 | Hanado et al. ............ 463/32 |
| 6,099,573 | A | | 8/2000 | Xavier ........................ 703/7 |
| 6,222,554 | B1 | * | 4/2001 | Berry et al. ............... 345/427 |
| 6,259,451 | B1 | * | 7/2001 | Tesler ........................ 345/419 |
| 6,278,464 | B1 | * | 8/2001 | Kohavi et al. ............ 345/440 |
| 6,323,884 | B1 | * | 11/2001 | Bird et al. ................. 715/810 |
| 6,407,748 | B1 | | 6/2002 | Xavier ........................ 345/672 |
| 6,414,679 | B1 | * | 7/2002 | Miodonski et al. ....... 345/420 |
| 6,546,397 | B1 | * | 4/2003 | Rempell .................... 707/102 |
| 6,700,578 | B1 | * | 3/2004 | Kamata et al. ............ 345/473 |
| 6,721,769 | B1 | * | 4/2004 | Rappaport et al. ........ 707/205 |
| 6,734,884 | B1 | * | 5/2004 | Berry et al. ............... 345/848 |
| 6,892,350 | B1 | * | 5/2005 | Oba et al. .................. 715/716 |

FOREIGN PATENT DOCUMENTS

WO WO 97/22952 6/1997

OTHER PUBLICATIONS

Camiciottoli et al., "3D Navigation of Geographic Data Sets", IEEE, Jun. 1998, pp. 29-41.*
Suomela et al., "The Evolution of Perspective View in WalkMap", Pers Ubiquit Comput, Sep. 2003, pp. 249-262.*

* cited by examiner

*Primary Examiner*—Phu K. Nguyen
(74) *Attorney, Agent, or Firm*—Michael Cameron, Esq.

(57) ABSTRACT

The invention relates to a system and method for presenting data such as CAD data and three-dimensional graphic design data. The presentation method includes a set of one or more pages upon which objects are arranged. The objects may be associated with models, images, text, or buttons. For example, an object may be a walkthrough object associated with a three-dimensional model. The method also includes a means for synchronizing data sets. For example, a two-dimensional floor plan may be synchronized with a three-dimensional walkthrough. Further, the system includes a means for determining collisions and climbing of an actor in a first person walkthrough object.

36 Claims, 42 Drawing Sheets

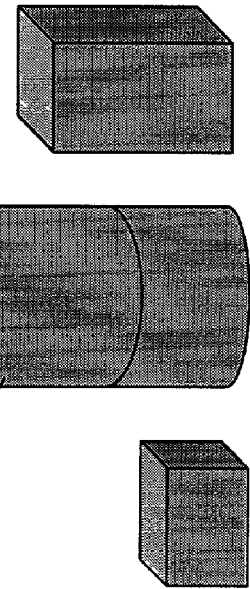
FIGURE 12C
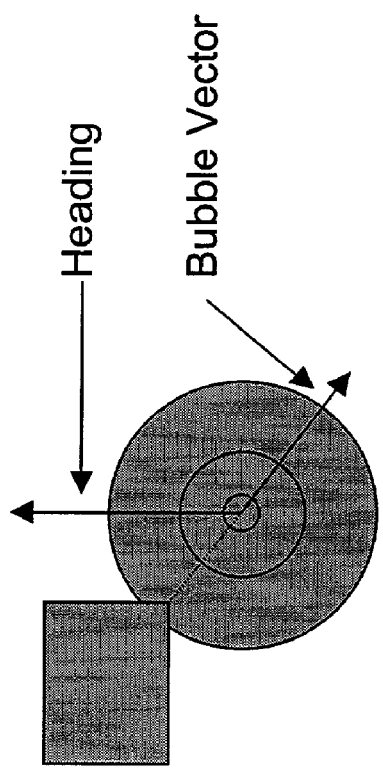
FIGURE 12D
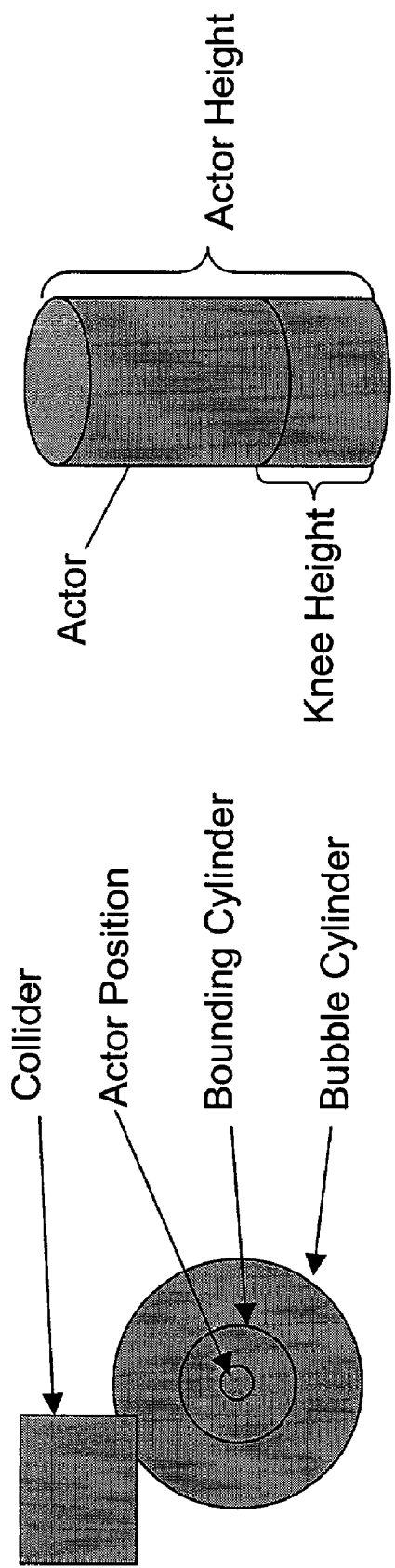
FIGURE 12A
FIGURE 12B

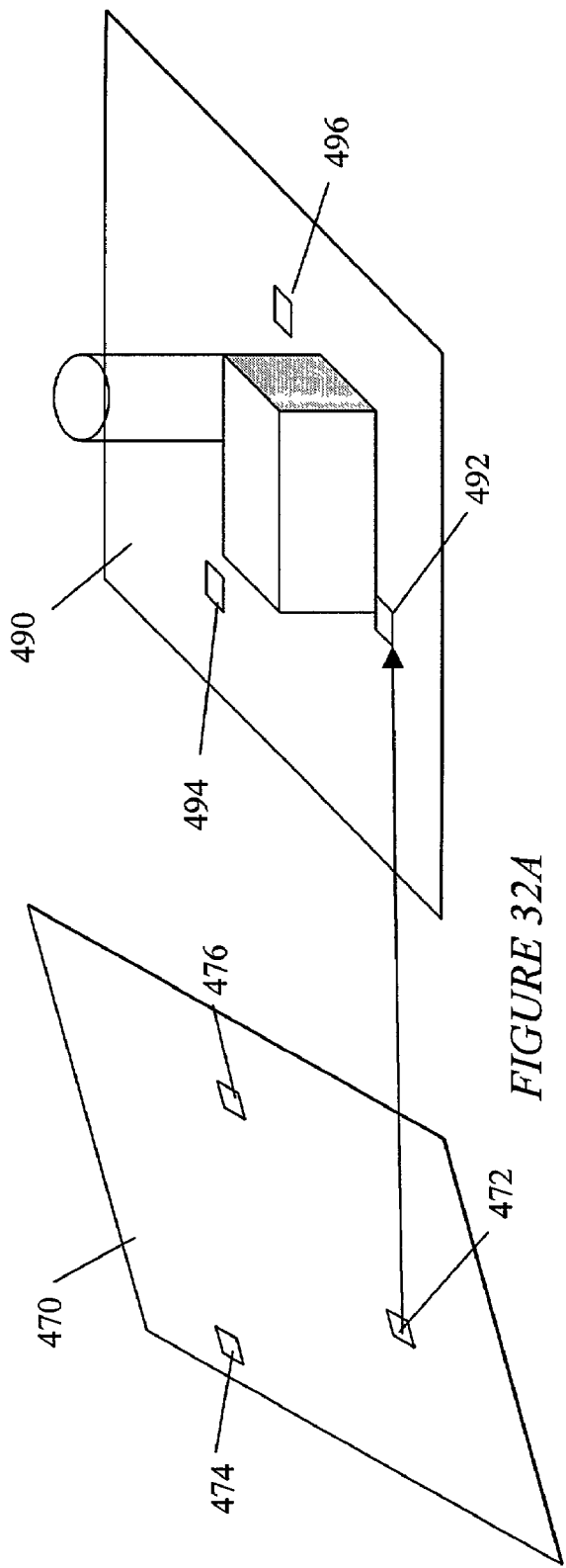
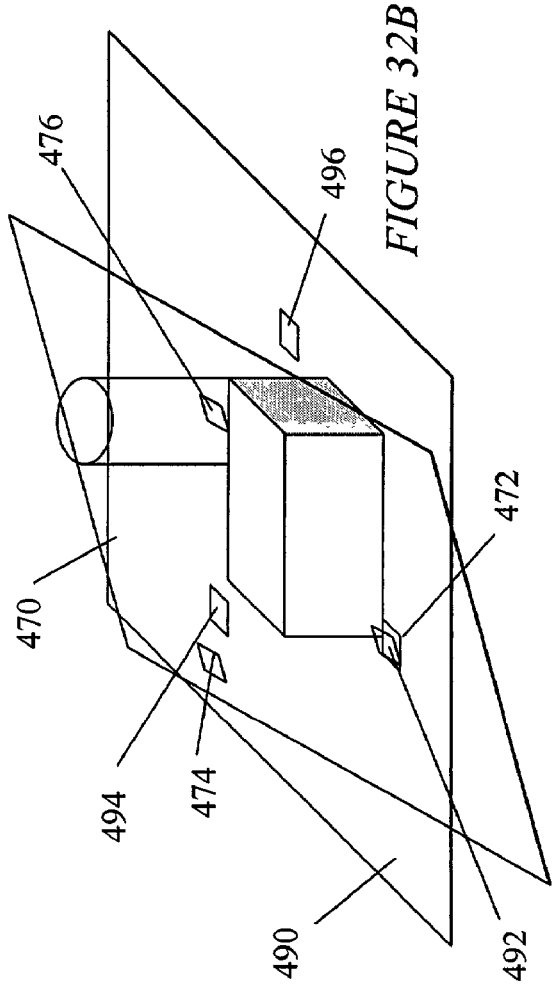
FIGURE 32A
FIGURE 32B

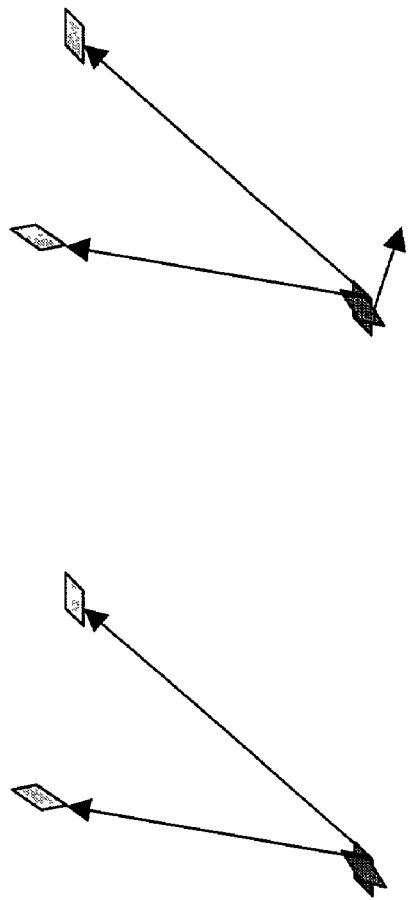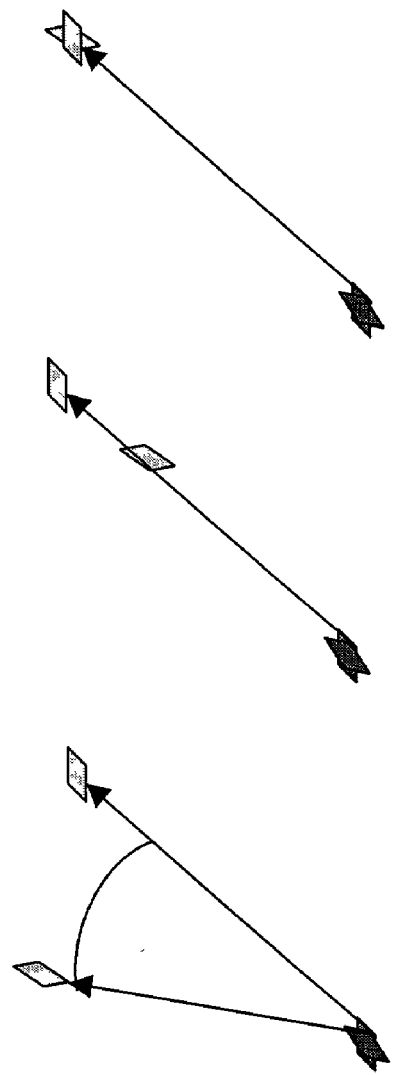

SYSTEM AND METHOD FOR PRESENTING THREE-DIMENSIONAL DATA

TECHNICAL FIELD OF THE INVENTION

This invention, in general, relates to the visual presentation of three-dimensional data. More specifically, the invention relates to a page-based presentation tool for presenting synchronized three-dimensional and two-dimensional images and walkthrough features.

BACKGROUND OF THE INVENTION

Engineers, architects and graphic designers are increasingly using computer aided drafting tools and three-dimensional graphics programs. These tools have had a great impact on industries such as engineering design, the automobile industry, architecture, graphic design, game design, video production, and interior design, among others. These programs have been used for designing manufactured parts, designing buildings, used for training videos, visual elements in video production, mock-ups of interior design or building placement, and other uses. However, these programs typically lack a method for presenting their output in a traditional format.

Typical three-dimensional graphics tools allow for the output of movies, images, or sets of images. A designer might provide an angle, vantage point, and/or path. The program may then generate an image or movie associated with the vantage point or path. However, these formats are limiting in that they lack interactivity. A subsequent viewer has no control over the path of the movie or the vantage point of the image.

On the other hand, traditional presentation tools present material in a slide-based format and permit the inclusion of certain graphics objects. Typically, these presentation tools allow for a slide-by-slide or page-by-page presentation of material. Some elements within the slides may be provided with dynamic attributes. Typical presentation tools permit the inclusion of movies and two-dimensional graphic formats. However, they lack the ability to include interactive three-dimensional formats and further lack the ability to interact with three-dimensional environments. Moreover, these traditional tools lack a means of synchronizing data objects and providing interactivity between objects.

Other presentation formats, such as Web pages, also present a page-by-page means of presenting information. Hereto, attributes of text and traditional two-dimensional images may be provided with some form of dynamic characteristic. However, typically, there lacks an ability to interact with three-dimensional objects, synchronization between two data objects, control of data objects with buttons and other objects.

As such, many three-dimensional graphics tools and presentation tools suffer from deficiencies in providing interactivity with three-dimensional data. Many other problems and disadvantages of the prior art will become apparent to one skilled in the art after comparing such prior art with the present invention as described herein.

SUMMARY OF THE INVENTION

Aspects of the invention may be found in a presentation tool. The presentation tool comprises a method and tool for making a page-by-page or slide-by-slide presentation. A page in the presentation has an object for presenting three-dimensional data that may be manipulated or may manipulate other objects on the page. These other objects may include icons associated with two-dimensional images or drawings, icons within a three-dimensional view, buttons, text, and movie objects, among others. Further, interactivity between various objects may manipulate visual characteristics such as rendering characteristics and parameters, shadows, vantage points, and display location, among others, in three-dimensional objects. These visual characteristics may also include zoom and pan on two-dimensional graphics elements. These visual characteristics may also include font size, color, and lettering within text. Further, the manipulation may include icons associated with two-dimensional and three-dimensional objects.

Another aspect of the invention may be found in an operable file for storing information and data associated with a presentation. The operable file may hold information interpreted for the functionality of the presentation tool.

Further aspects of the invention may be found in a button situated on one or more pages of a presentation. The button automatically selects a label based on its function. The button may also be selectively programmed to perform various functions. The button may further indicate activation by changing a visual characteristic.

Additional aspects of the invention may be found in a package for distributing a presentation. The package has a viewer, an operable file, and three-dimensional models and other data associated with the operable file.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein:

FIGS. 12A, 12B, 12C and 12D are schematic diagrams depicting a system according to the invention;

FIGS. 32A and 32B are schematic diagram depicting the alignment of two points;

FIGS. 33A, 33B, 33C, 33D and 33E are schematic diagrams depicting the alignment of a second set of points;

DETAILED DESCRIPTION OF THE INVENTION

As the reliance in three-dimensional graphic tools and CAD systems increases, new methods are required to make presentations of the resulting models. The present invention includes a presentation tool for presenting a page-by-page or slide-by-slide presentation having interactive three-dimensional objects. The tool allows for walk-throughs and orbit views of three-dimensional data and synchronization between three-dimensional and two-dimensional.

Figure 1:
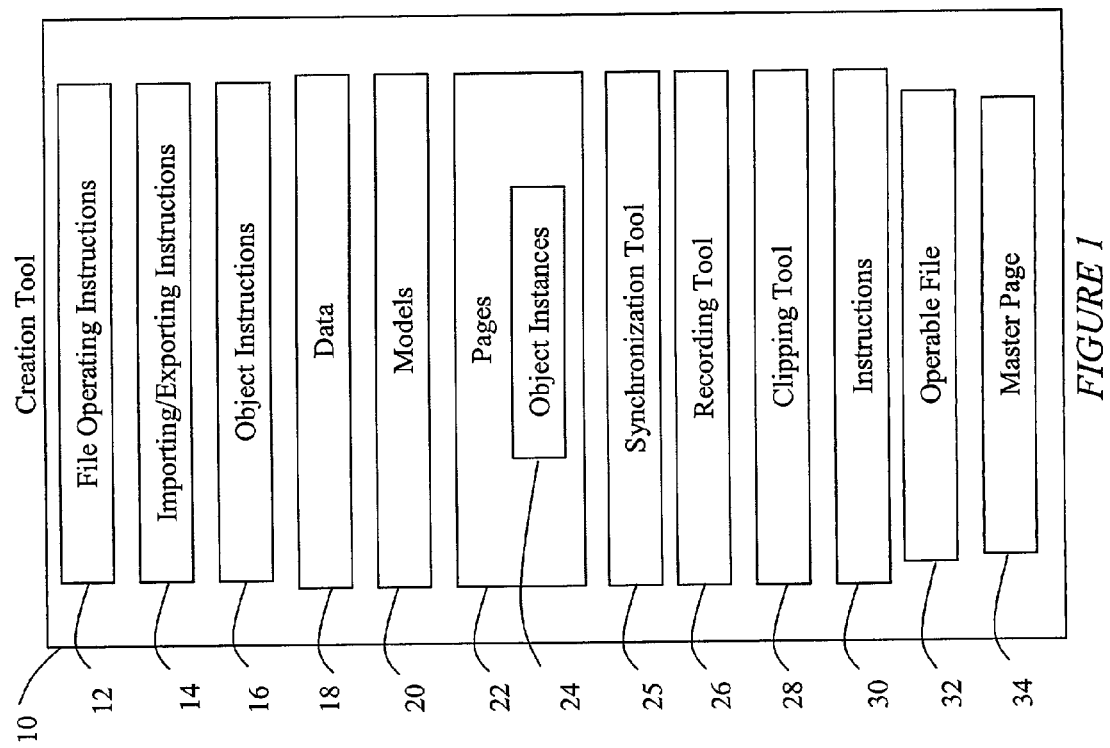
FIG. 1 is a schematic block diagram depicting a creation tool, according to the invention.

FIG. 1 is a schematic block diagram depicting the system 10 according to the invention. The system may include file operating instructions 12, importing/exporting instructions 14, object instructions 16, data 18, models 20, pages 22, synchronization tool 25, recording tools 26, clipping tools 28, instructions 30, operable files 32 and master pages 34. The pages 22 may include object instances 24. However, each of these elements may or may not be included, together, separately, or in various combinations, among others.

The system 10 is implemented as a software program. The program may be written in various languages and combinations of languages. These languages may include C+, C, Visual Basic, and Java, among others. Further, the system 10 may take advantage of various software libraries including open GL and Direct 3D, among others.

The file operating instructions 12 may provide functionality including Open, Save, Save As, Close, and Exit, among others. These instructions control the interaction with presentations, operable files, data, and models, among others.

The importing/exporting instructions 14 may function to enable the importing of various models and image formats. Further, it may permit the exporting of operable files, movies, models and packages. For example, a package may include a viewer, an operable file, model data, and other associated data. In this manner, presentations may be distributed in packages or on auto-run CDs without requiring preinstalled software.

The importing and exporting instructions 14 may also enable the interpretation of various file formats including formats for three-dimensional data, two-dimensional data, image files, text, spreadsheets, compression formats, databases, vector drawings, and movie formats, among others. These formats may be found with extensions such as DWG, IDW, IDV, IAM, PRT, GCD, CMP, DXF, DWF, JPEG, GIF, PNG, PLT, HGL, HPG, PRN, PCL, IGES, MI, DGN, CEL, EPS, DRW, FRM, ASM, SDP, SDPC, SDA, PKG, BDL, PAR, DFT, SLDPRT, SLDASM, SLDDRW, SAB, SAT, STP, STL, VDA, WRL, CG4, ODA, MIL, GTX, HRF, CIT, COT, RLE, RGB, TIF, PICT, GBR, PDF, AI, SDW, CMX, PPT, WMF, WPG, VSD, IFF, CDR, DBX, IMG, MAC, NRF, PCX, PPM, PR, TGA, ICO, XWD, Fax formats, SAM, STY, DOC, WRI, LTR, WS, DBF, DB, PX, WK*, XLS, WKQ, ARC, LZH, ZIP, CGM, AVI, MPG, QSM, QSD, Bitmap, RTF, TXT, and ASCII, among others.

The object instructions 16 may function to permit the insertion of objects into a page and provide those objects with functionality. The objects may be included as part of the program itself or may be functional files such as DLL files that are accessed by the program 10. These object instructions 16 may include instructions for objects such as orbital views, walkthrough views, sectional views, two-dimensional image objects, two-dimensional vector drawing objects, text, shapes, line, buttons, and movies, among others.

The data 18 may include various preference parameters associated with the program 10, preference and setup parameters associated with the objects 16 or the object instances 24, other data associated with the pages 22, operable files 32, master pages 34, among others.

The models 20 may include imported three-dimensional, two-dimensional and other models. These models may be associated with object instances 24.

Pages 22 may take the form of slides, pages or panels that may be viewed within a window of a browser or viewer, printed on a physical page, or output as an image or file, among others. Associated with the pages 22 are object instances 24. These object instances 24 may be objects having an associated object instruction 16 and established parameters characteristics, associated models 20, and functionality, among others. The object instances 24 may be arranged on pages 22 to provide functionality and a visual appearance to pages 22. Further, these object instances 24 may interact with one another and the pages to provide greater functionality. For example, the object instance 24 may be a button, three-dimensional walkthrough, three-dimensional orbital view, sectional view, two-dimensional image or vector drawing, text, movie, or imported file, among others. Buttons may be programmed to switch pages, change visual characteristics of objects, or initiate a function. Other data sets and visual formats may also be linked or synchronized such as a two-dimensional image object with a three-dimensional walkthrough object, text objects with a three-dimensional walkthrough object, or a three-dimensional walkthrough object with a three-dimensional orbital view object, among others.

Additional tools such as the synchronization tool 25, recording tool 26, the clipping tool 28 or other tools such as optimization tools may be used to provide additional functionality to various object instances 24 and pages 22. For example, the synchronization tool 25 enables users to synchronize two or more data sources. An exemplary synchronization method may be seen in FIG. 28. The recording tool 26 may permit a sequence of events associated with an object or set of objects to be recorded and subsequently replayed. The recording tool may be tied to object instances 24 such as buttons or walk through views or orbital views, among others. The recording tool 26 may also include smoothing and transition functions to make visual presentations more aesthetic.

In another example, a clipping tool 28 may provide the ability to clip part of a three-dimensional object or data set. The clipping tool 28 may also be tied to various object instances 24 such as three-dimensional objects and buttons.

The functionality applied to the creation tool 10, the interaction between pages and objects and other tools, and other functionality may be accomplished through instructions 30. These instructions 30 may take various forms including scripts and programming languages mentioned above, among others.

The creation tool 10 may also interact with an operable file 32. Once a presentation is prepared and saved, it may become an operable file 32. This operable file may be shared among users of the program and computers having associated viewer to replay the interactions set up by the creation tool 10. The operable file may also store the pages and object instances for later modification. The operable file may also include models, data, the pages, the master page 34 and at least parts of the object instructions 16.

In addition, the creation tool 10 may permit the creation of a master page 34. The master page 34 may function to provide a common visual characteristic among all the pages 22 that subscribe to the master page 34.

Figure 4A:
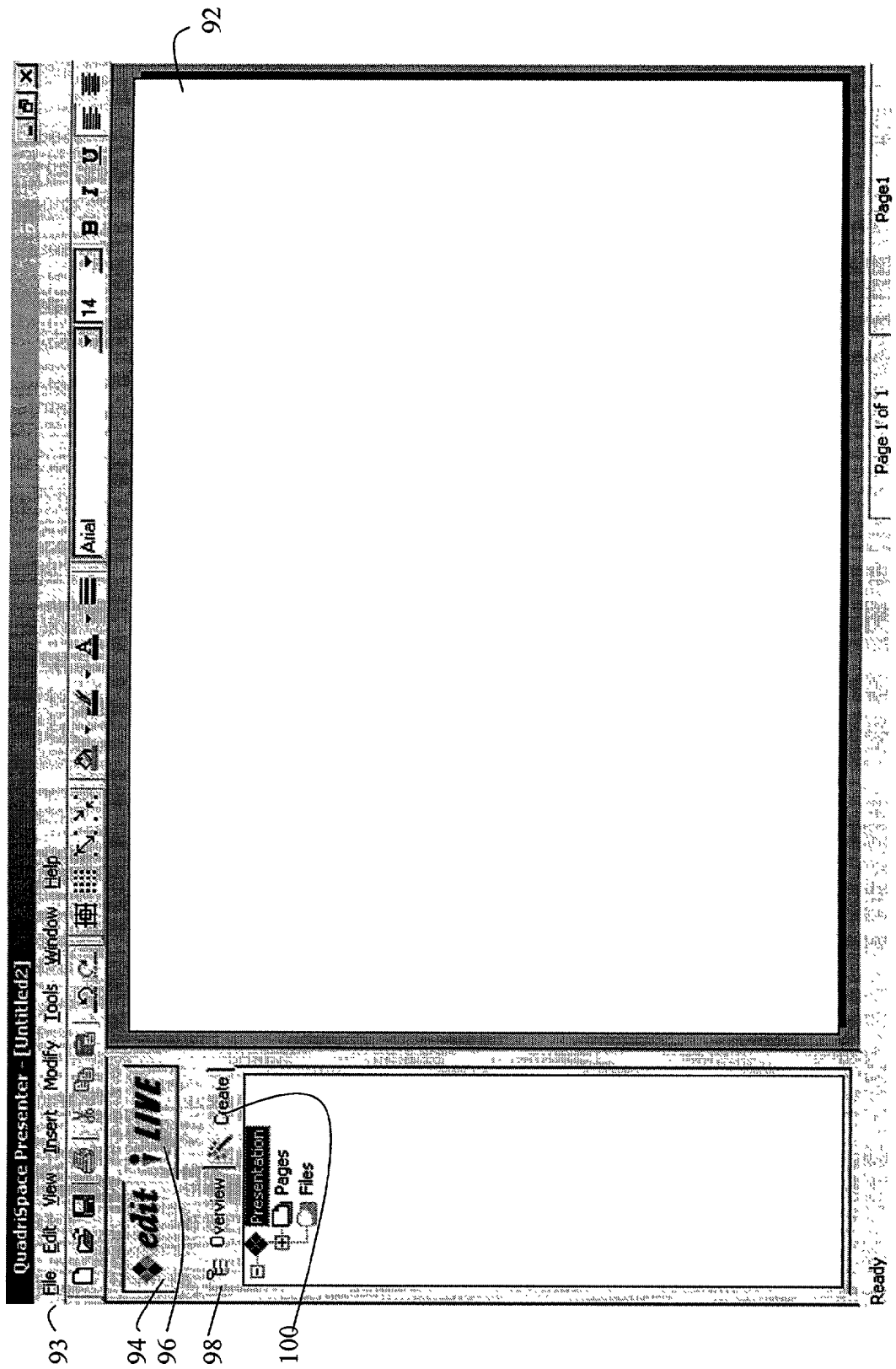
FIGS. 4A and 4B are pictorials depicting an exemplary embodiment of the system.
Figure 4B:
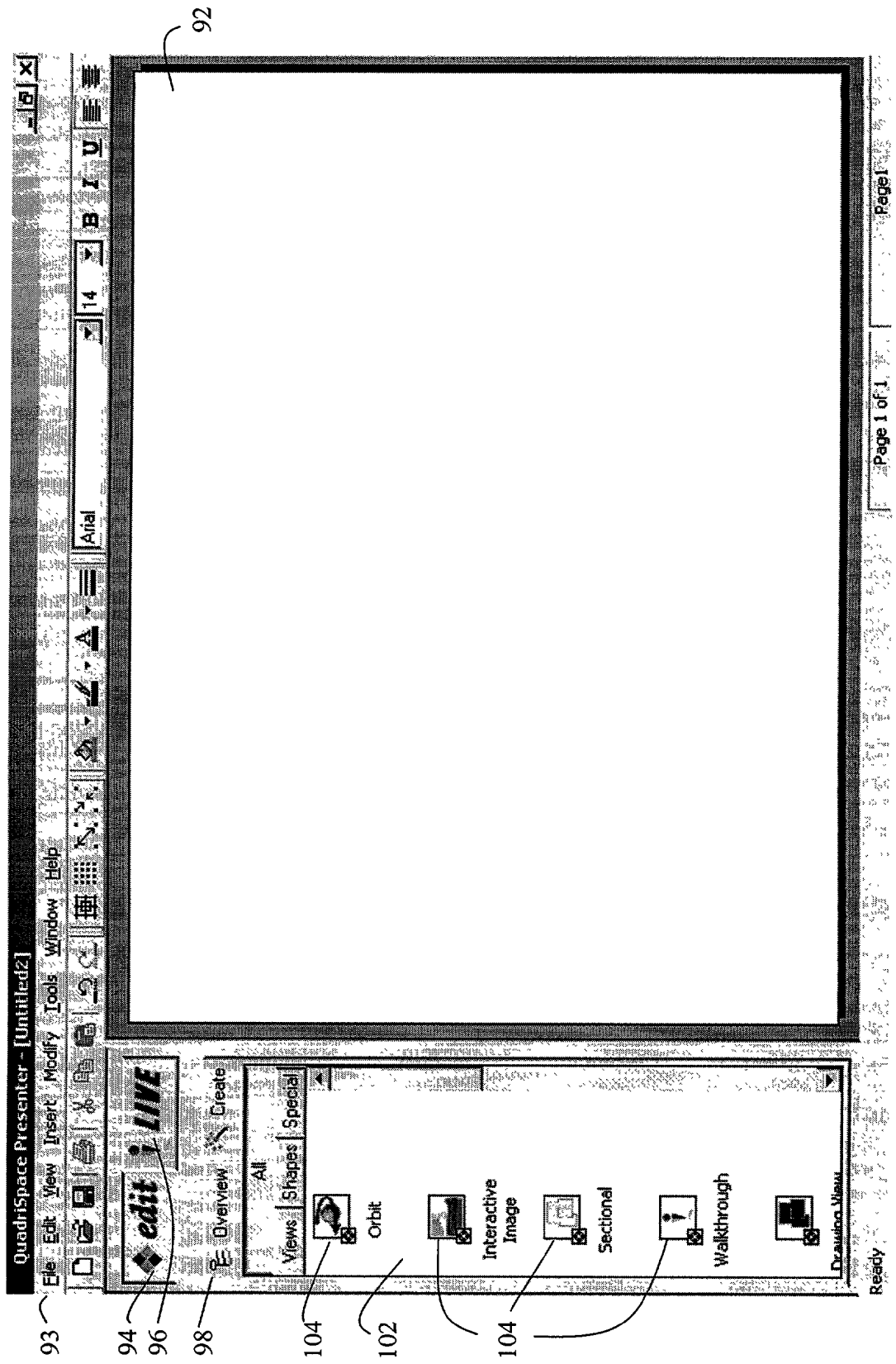

Examples of an embodiment of the creation tool 10 may be seen in FIGS. 4A and 4B. However, the creation tool may have some, all or none of these elements. These elements may be included together, separately, or in various combinations, among others.

Figure 2:
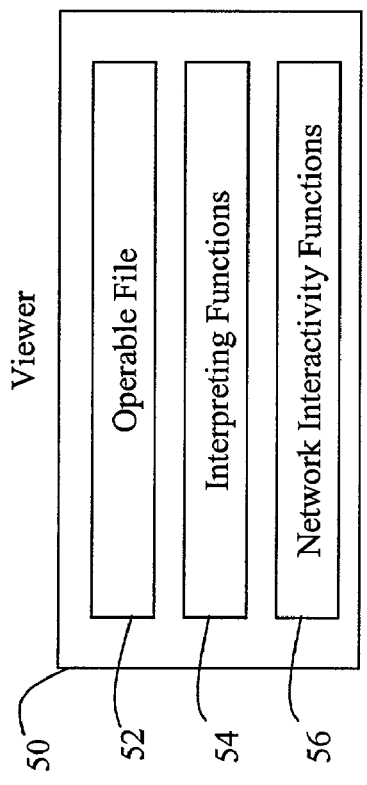
FIG. 2 is a schematic block diagram depicting a viewer according to the invention.

FIG. 2 is an exemplary embodiment of a viewer 50. The viewer 50 may include interpreting functions 54 for interpreting an operable file 52. The operable file, for example, may be created in a creation tool 10 and distributed among a set of users. The viewer 50 functions to permit viewing and interaction with the operable file 52 while limiting certain editing functions. The viewer 50 may therefore be a smaller program enabling easy distribution. The viewer may also include network interactivity instructions 56. These network interactivity instructions 56 may enable interactions with a presentation performed in one viewer to be mimicked by another remotely located viewer. For example, copies of a presentation may be opened in two remotely located viewers. The viewers may then be linked. Using a protocol, the two viewers 50 may communicate to synchronize interactivity with the presentation. The network interactivity instructions 56 may also be included with the creation tool.

The viewer 50 may be programmed using various languages including those described above. In addition, a viewer 50 may be a stand-alone program or a plug-in for presentation software or browsers.

Figure 3:
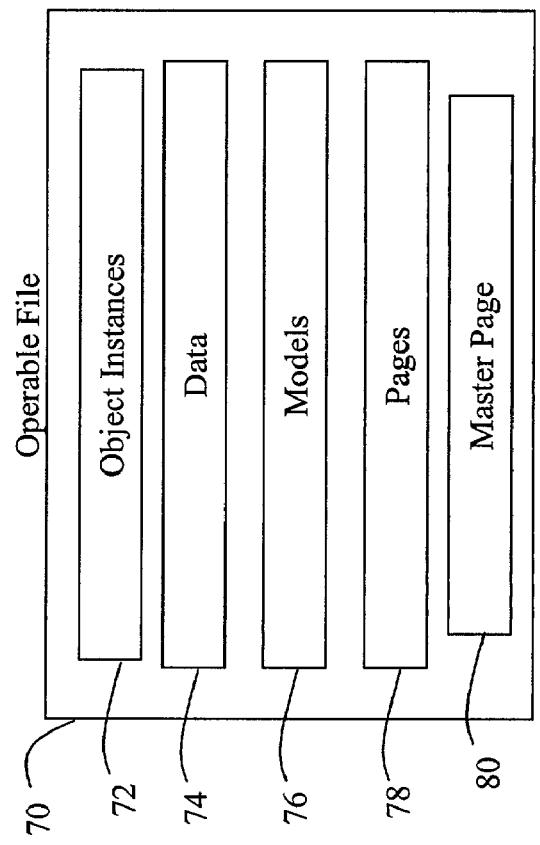
FIG. 3 is a schematic block diagram depicting an operable file according to the invention.

FIG. 3 depicts an operable file 70. The operable file is created in the creation tool 10 and stores the pages, object instances and various data and models associated with the pages and object instances. The operable file 70 may include some or all of the object instructions 72, data 74, models 76, pages 78 and a master page 80. The object instances 72 may be objects defined in the creation tool that are associated with the model or data and one or more pages 78. The object instances 72 carry with them the information and functionality required for interpretation in either the creation tool or a viewer.

Data and models 76 may take various forms including preferences, location of object instances on pages, three-dimensional models, two-dimensional image data, two-dimensional vector data, text, shape objects, and other data associated with object instances 72 and pages 78 and master page 80.

Pages 78 may have object instances 72 distributed about the page to provide a visual appearance and interactivity. These pages may also comply with a master page 80. A master page 80 may hold instructions for the placement of common element objects and visual appearance of various pages ascribing to the master page 80.

FIGS. 4A and 4B depict exemplary embodiments of the creation tool. In the creation tool, a page 92 may be developed by placement of various graphic elements and objects about the page. Opening, Closing, Saving and Printing and other functions associated with the creation of a page and the functionality of the object associated with the page may be controlled by a control panel 93 which provides access to file operating instructions, import/export instructions, preference data, and various tools for establishing functionality of objects and overall presentation functionality for the set of pages. The presentation tool may include an Edit button 94 and a Live button 96. Selection of one or the other establishes the mode of operation of the presentation tool. If the Edit button 94 is activated, objects may be placed on a page, arranged, and have parameters associated with object instances edited. Further, the Edit mode may enable various functionalities to be added to the page or pages 92. In live mode 96, the program may function to display the functionality and provide interactivity with the object's functionality provided to pages 92 through the editing mode.

The presentation creation tool may also provide an overview tab 98. In this exemplary embodiment, the overview tab 98 presents a tree view of pages and files associated with objects and object instances. The pages may include a listing of pages. The files may include models, two-dimensional data files, two-dimensional image files, vector files, text, and other files associated with the objects and the pages.

The creation tool may also include a create tab which provides access to objects which may be placed about the page 92. FIG. 4B shows a listing 102 of various objects that may be placed about page 92. The objects 104 may be associated with models or other data and provided with preferences to form instances of the model objects that are arranged about the page or pages 92. These objects 104 may be part of the overall program. Alternately, the objects may exist as external libraries that are imported into the program. In one exemplary embodiment, objects may be added to the program as DLLs. If a presentation containing an unknown object were to be opened, the program may seek a corresponding object DLL or ignore the object without losing the functionality of other known object instances in the presentation.

Once a set of pages with various object instances and models and data associated with the pages are established, the pages may be saved along with the models and object instances to a separate file. Further, models associated with the objects may be exported.

Figure 5:
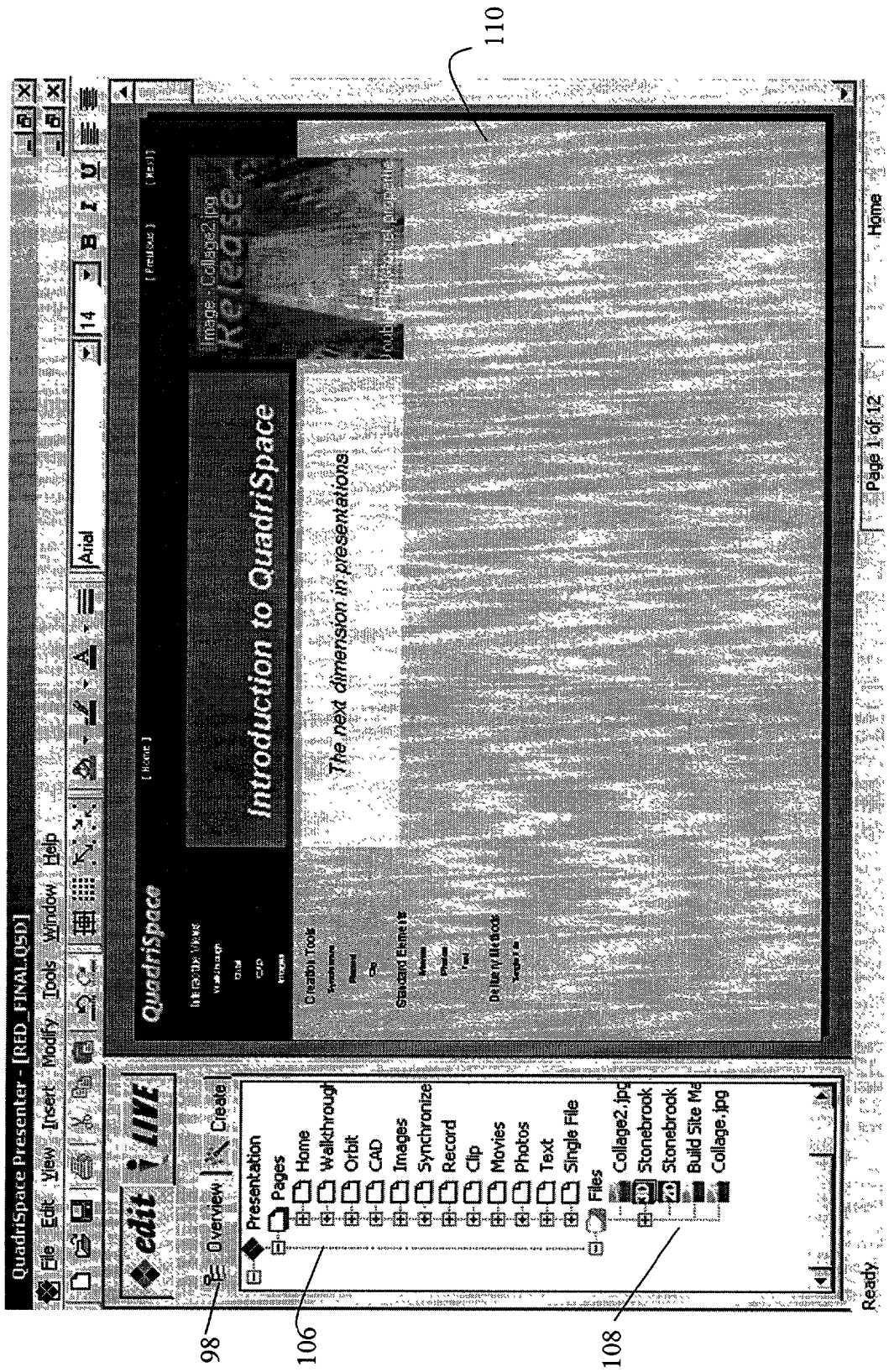
FIG. 5 is a pictorial depicting an exemplary embodiment of the system as seen in FIG. 1.

FIG. 5 is an exemplary embodiment of the creation tool with a set of pages or presentation presented in edit mode. In this example, the overview tab is selected showing the presentation with a set of pages and files associated with objects within those pages. About the page 110 are placed various graphic text elements and buttons. In this case, the presentation has been saved as a presentation file and may be exported for viewing within a viewer.

Figure 6:
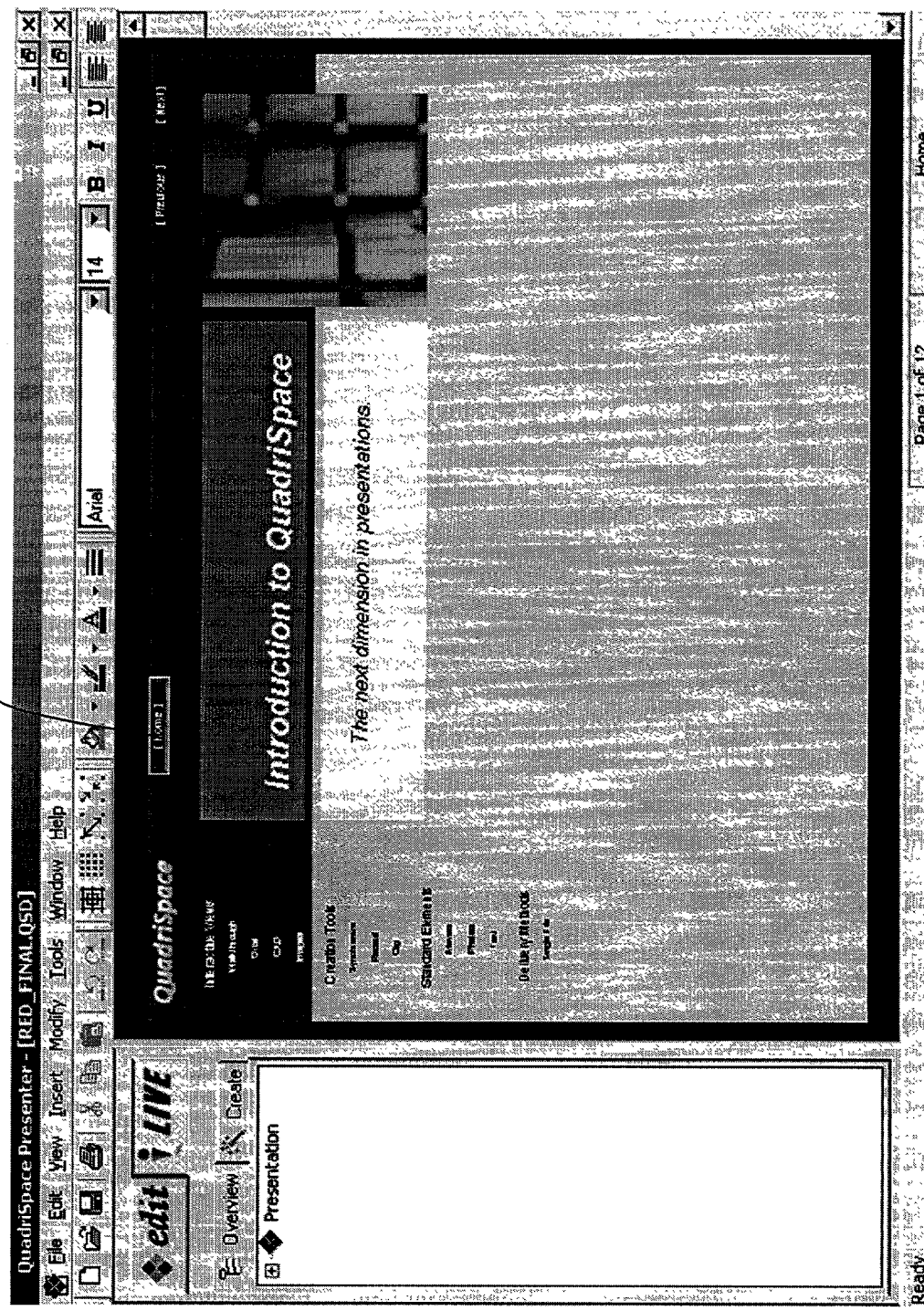
FIG. 6 is a pictorial depicting an exemplary embodiment of the system as seen in FIG. 1.
Figure 7:
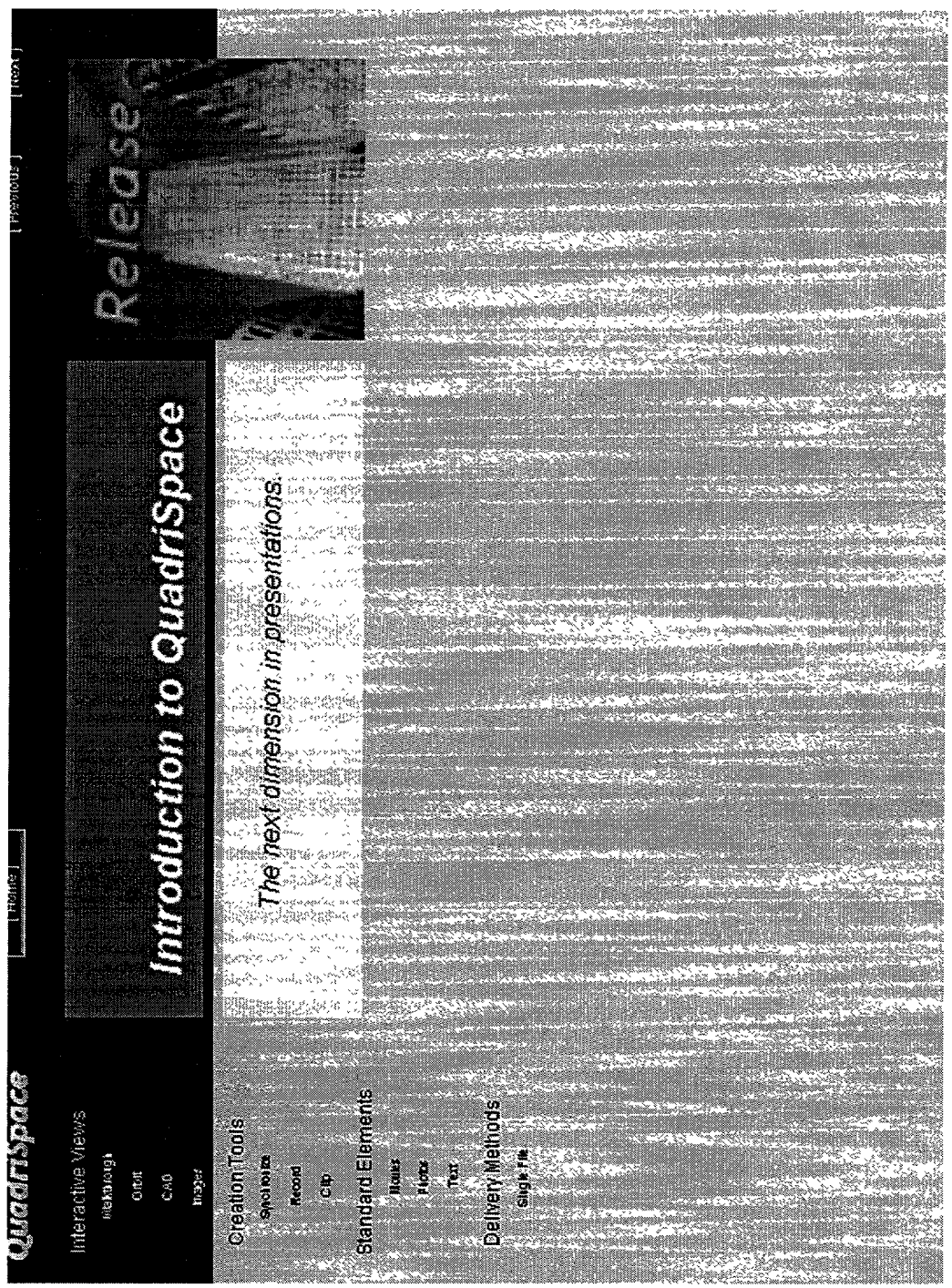
FIG. 7 is a pictorial depicting an exemplary embodiment of the system as seen in FIG. 2.

FIG. 6 depicts the same page 110 in live mode. In this case, interactivity with the buttons is enabled as seen through the depression of button 112. Using the edit and live modes, users may jump between editing objects on the page and, in live mode, testing the functionality of those objects. The file may then be exported as a presentation file and opened in a viewer. FIG. 7 shows the page opened in a viewer. In this case, the button may be activated as would in the live mode within the creation tool.

Figure 8:
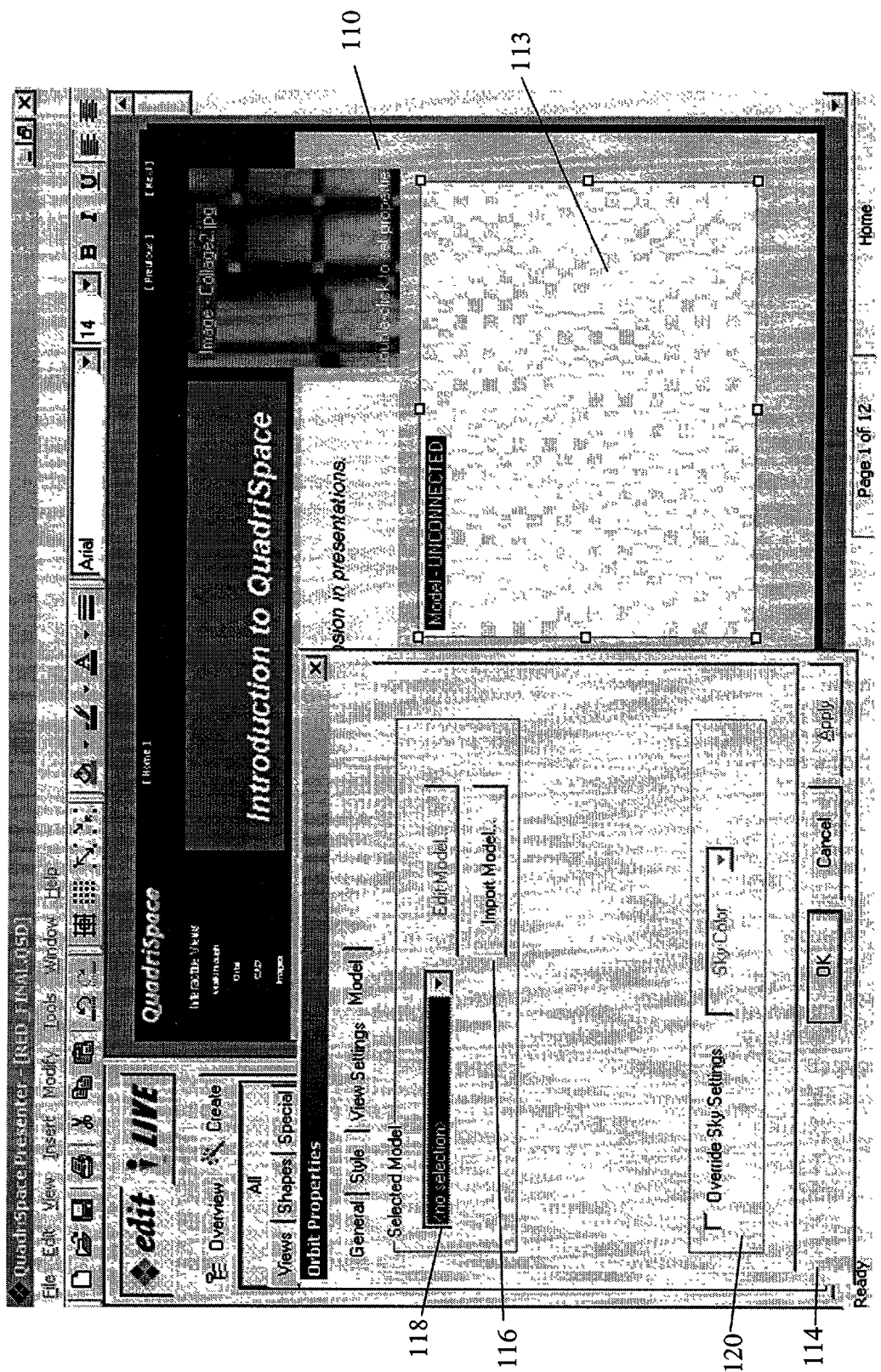
FIG. 8 is a pictorial depicting an exemplary embodiment of the system as seen in FIG. 1.

FIG. 8 depicts the insertion of an object within a page 110 in edit mode. Once the object is located on the page 110, preferences and properties for the object 112 may be edited. In this case, a three-dimensional model may be connected to an orbit object. In the orbit properties panel 114, a model tab may be selected. Subsequently, a model may be imported using the imports model button 116 or a model may be selected from existing models using a pull-down menu 118. In addition to associating a model with an object, various other settings such as style, other visual characteristics, object size and object placement may be manipulated. Each object type may have various visual characteristics uniquely associated with that object type. In this case, for example, the visual characteristics of the sky may be set as seen in a setting panel 120. Visual characteristics may include rendering characteristics (hidden line, photo realism, cartoon, watercolor, oil painting, motion blur, blur, noise, pencil, charcoal, map pencil), actor properties, terrain, changing parts, viewing position, viewing orientation, focal point, shadows, sky settings, lighting settings, camera angles, material characteristics (color, displacement map, reflectivity, transparency, reflection map, and texture) for three-dimensional objects; rendering characteristics (hidden line, photo realism, cartoon, watercolor, oil painting, motion blur, blur, noise, pencil, charcoal, map pencil), zoom, pan, sharpness, associated image or data, for two-dimensional objects; font, color, and size for text objects; color, shape, size, width, height, and thickness for lines and shapes; and transparency/opacity, visibility, motion, layer control, past transformations, size, position, orientation, location, color, shape, angle, mode, and meta data for all objects, among others. Visual characteristics may vary between objects. In addition, various objects may require differing parameters and associated data files, among others.

Figure 9:
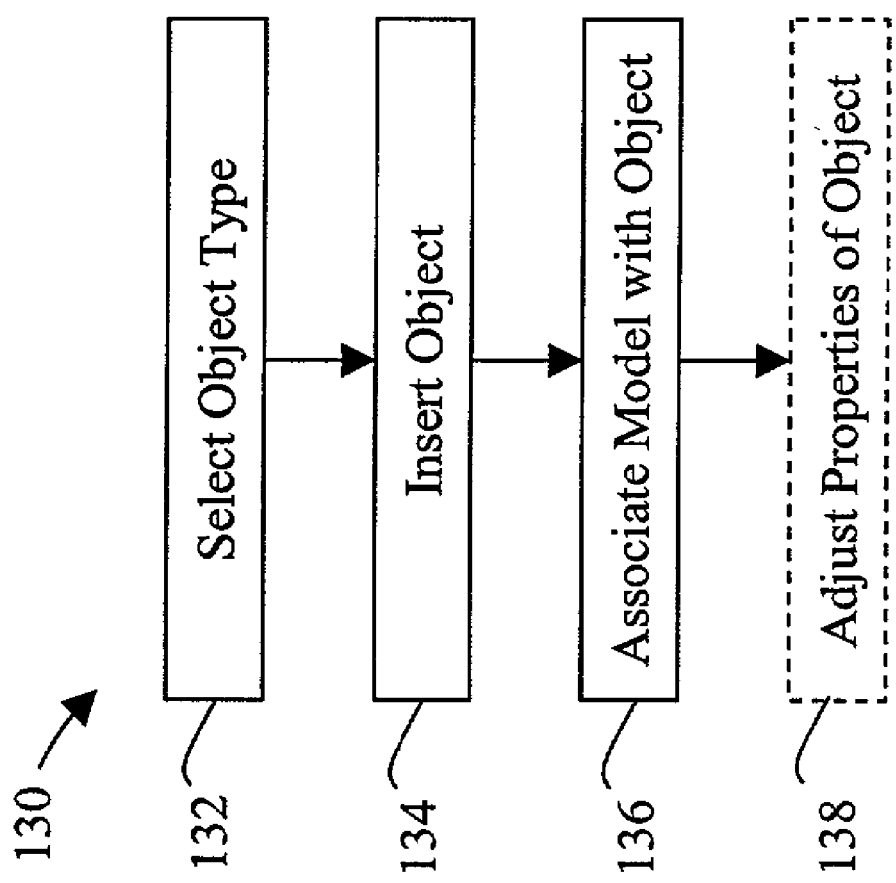
FIG. 9 is a block flow diagram of an exemplary method for use by the system of FIG. 1.

FIG. 9 depicts an exemplary method for use by the system as seen in FIG. 1. Much like the example in FIG. 8, an object type may be selected and inserted into a page as seen in blocks 132 and 134. The object type may, for example, be a three-dimensional object, a two-dimensional object, various text and shaped objects, among others. During insertion, as seen in block 134, the object may be placed in a location on the page and sized. Then, the object may be associated with a model as seen in a block 136. For example, a three-dimensional walkthrough object would need to be associated with a three-dimensional model. In another example, a two-dimensional vector object would need to be associated with a vector drawing. Subsequently, the properties of the object may be adjusted as seen in a block 138. These properties may include location, size, visual characteristics and other characteristics associated with the object, among others.

Figure 10:
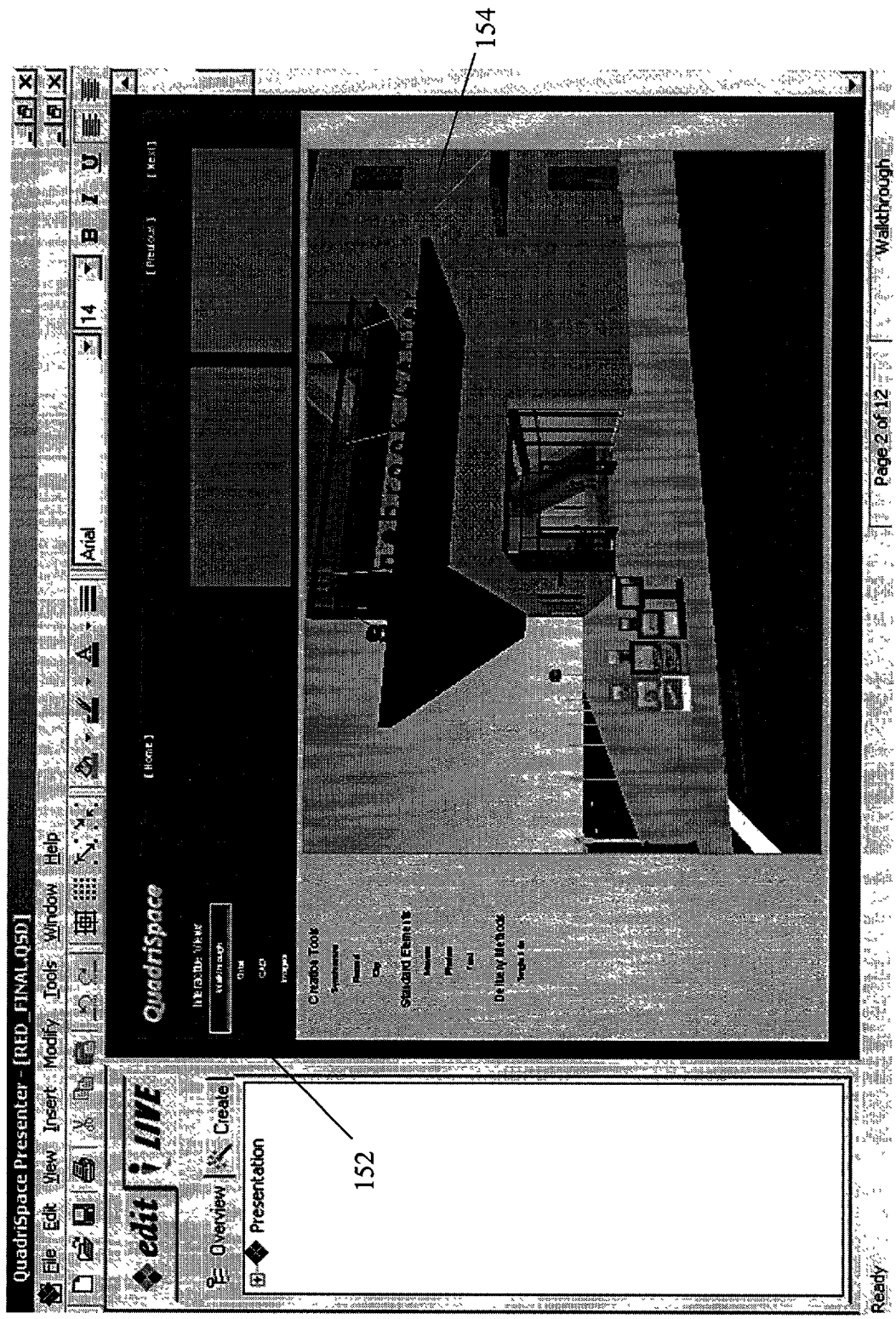
FIG. 10 is a pictorial of an exemplary embodiment of the system as seen in FIG. 1.

Once an object or set of objects has been placed in a page, the page may be tested in a live mode. FIG. 10 depicts the presentation as seen in FIG. 5 in live mode. In this example, a walkthrough button has been activated and the presentation has moved to page 2. On page 2 is a walkthrough object 154 that has been associated with a model. The walkthrough object displays a first person view of a three-dimensional data with various characteristics associated with the preferences and properties of the object 154. The user may interact with the object 154 to walk through or proceed through the three-dimensional data as one would if you were walking through a region represented by the three-dimensional data.

Figure 11:
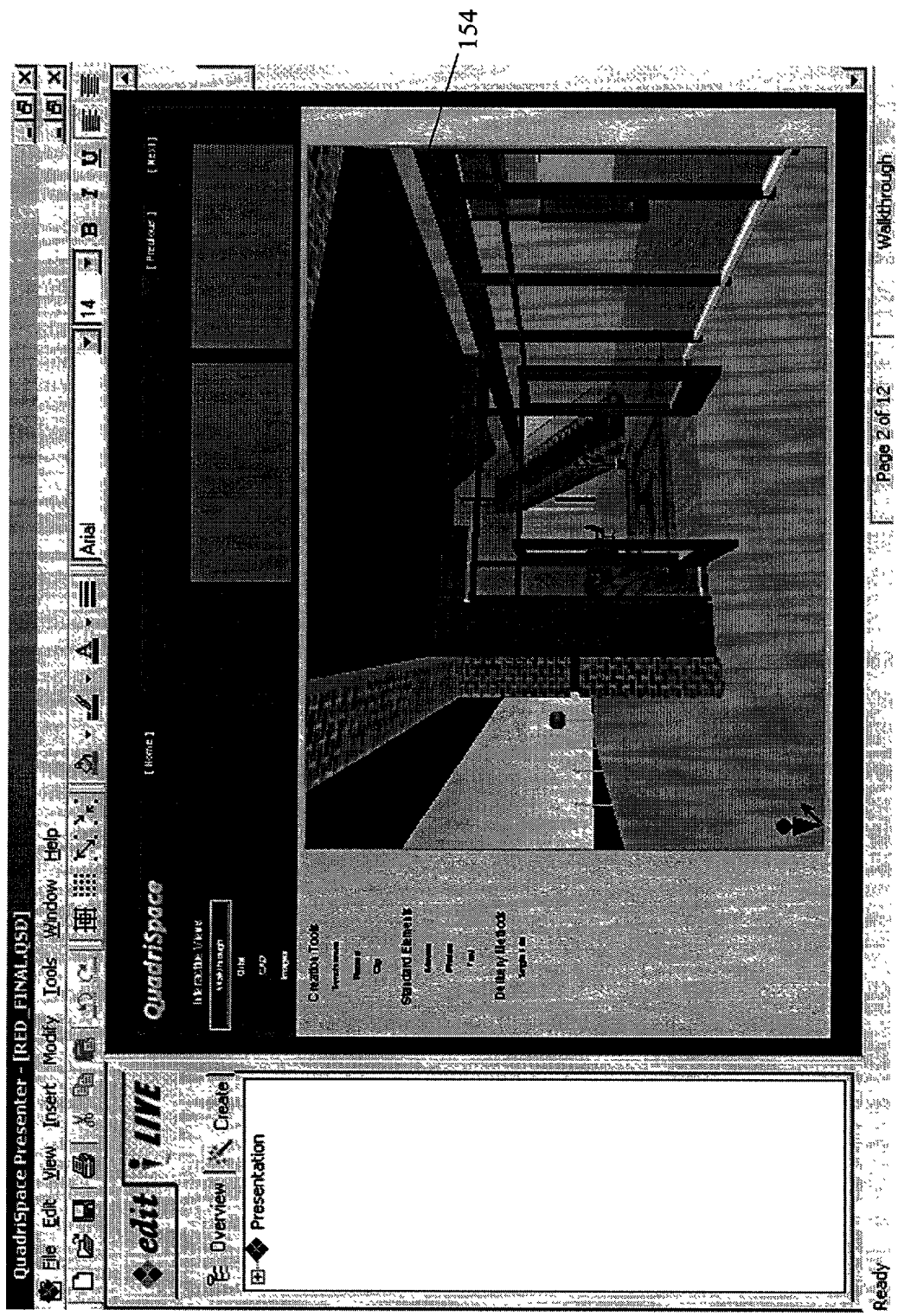
FIG. 11 is a pictorial of an exemplary embodiment of the system as seen in FIG. 1.

FIG. 11 depicts the object 154 after the first person view has been directed to advance towards the door. This may be accomplished by rendering a region of the three-dimensional model that would be seen from that location looking in the indicated direction. However, the object may be presented by selectively rendering all or part of the three-dimensional model.

In one exemplary embodiment, the user may interact with the walkthrough object using a mouse or other graphic input device. For example, holding a left mouse button with movement of the mouse may permit rotation about the vantage point, double-clicking the left mouse button may permit jumping to a point indicated, and holding a right mouse button with movement of the mouse may permit advancing and rotation of the vantage point. Double-clicking the left mouse button may move the vantage point to the location indicated by the mouse. A collision detection method may be used to determine the location of the vantage point.

Presenting a walk-through object presents various complications associated with avoiding objects or preventing walk through of virtually solid objects depicted in the three-dimensional model. FIG. 12A depicts an actor associated with the first person view approaching an object with which the actor may collide, termed collider. The creation tool or viewer may function to establish a bubble cylinder and boundary cylinder about the actor position. If the collider were to touch the bounding cylinder, the actor is deemed to have collided with the collider. FIG. 12B depicts the collider crossing into the bubble cylinder. As the collider crosses into the bubble cylinder, a bubble vector is created. A bubble vector is added to the heading vector to create a new direction for the movement of the actor. In this way, the actor may avoid collisions.

The system may also permit an actor to climb objects. These objects may be stairs, steps, curbs, stools or other objects that meet a height requirement. FIG. 12C shows an actor having an actor height and some percentage of the actor height or specification of a knee height. A system may establish algorithms that permit an actor to walk on objects that are lower than the knee height and collide with objects that are greater than the knee height, as seen in FIG. 12D.

Figure 13:
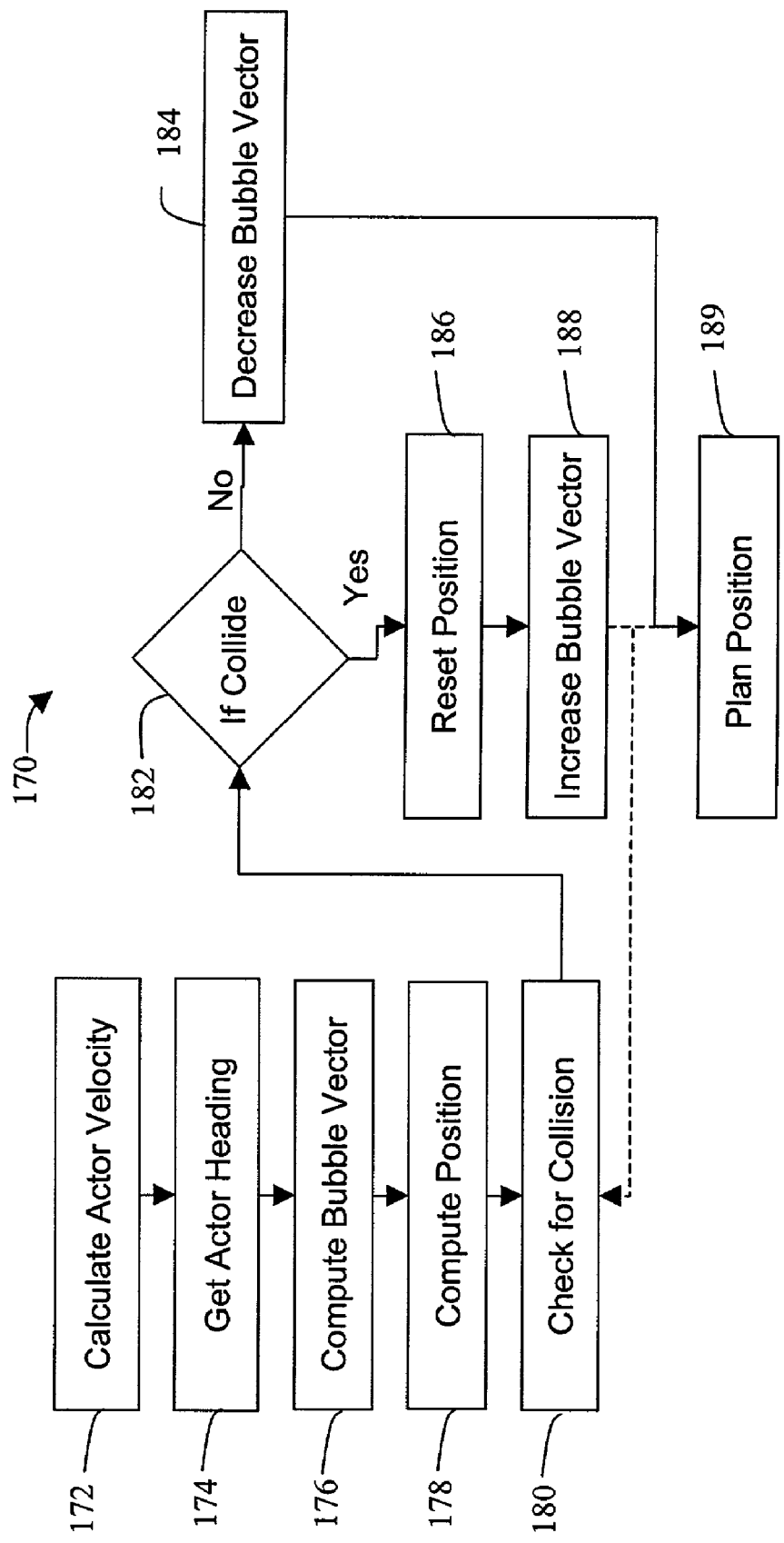
FIG. 13 is a block flow diagram of an exemplary method for use by the systems of FIG. 1 and FIG. 2.

FIG. 13 depicts an exemplary method for establishing a new position and preventing collisions. As seen in block 172, the system may determine the velocity of the actor. The velocity may be a function of interactions with the user or other parameters associated with the actor. From this velocity, a heading vector may be established, as seen in 174.

The system may then determine a bubble vector based on the presence of colliders within the bubble boundary. This calculation may take into account, for example, the closest collider to the boundary cylinder. Alternately, the bubble vector may have a set magnitude or be determined using various algorithms and sets of collider points, among others. An algorithm for altering the bubble vector may be seen in FIG. 16.

Once the heading vector, bubble vector and position are determined, the potential new position may be calculated as seen in a block 178. With this potential new position, the system may check for collisions as seen in a block 180. The collision may be the presence of a collider object within the boundary cylinder of the actor. An exemplary method for checking for a collision may be seen in FIG. 14.

If no collision is detected the bubble vector may be decreased for subsequent moves, as seen in a block 184 and the future position planned, as seen in a block 189. However, if a collision is detected, the actor may be reset to the previous position, as seen in a block 186, and the bubble vector may be increased, as seen in a block 188. The system may then re-plan the position as seen in a block 189. This may include restarting with block 172 or checking for a subsequent collision as seen in a block 180, among others.

Figure 14:
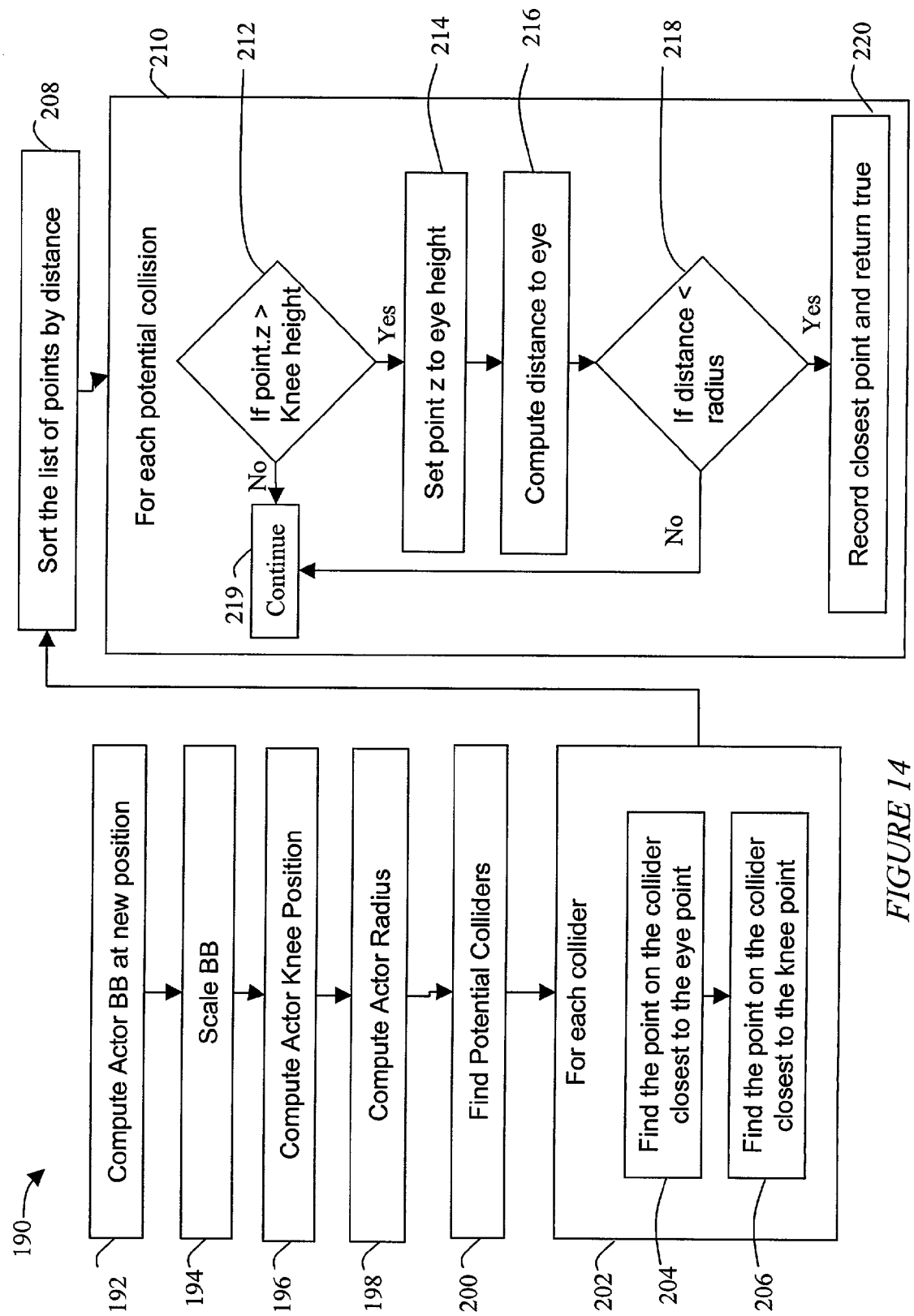
FIG. 14 is a block flow diagram depicting an exemplary method for use by the systems as seen in FIG. 1 and FIG. 2.

FIG. 14 depicts a method for checking for a collision. As seen in block 192, a boundary box is determined for the actor in the new position. A boundary box may be used in place of a cylinder to accelerate calculations. However, a cylinder may alternately be used. If necessary, the boundary box is scaled as seen in block 194. In one embodiment, the size of the boundary box may be preset. Alternately, the size of the boundary box may be set in accordance with the boundary bubble, bubble vector, or some other parameter. The knee position of the actor may be calculated as seen in block 196. The knee position may for example be determined as a percentage of the actor's height or a set height, among others.

The radius of the actor is determined and compared with nearby objects, termed colliders, as seen in blocks 198 and 200. The radius of the actor may be a set parameter or may be varied in accordance with an algorithm. For each of the colliders, the system may determine a point closest to the eye and a point closest to the knee positions. The determination of the closest point may be a substitute for determining all points along a line or edge. The list of colliders and/or points on the colliders may then be sorted by distance as seen in block 208. From this list, the system determines whether a collision occurs and if the object may be climbed. For each of the points, the system checks the height of the point with that of the knee. If the height is less than the knee, the actor may be permitted to climb the object. Climbing may be accomplished by dropping the actor on the new point or setting the vertical location of the actor's lowest point equal to that of the height of the object. In this exemplary method, the system continues to test subsequent colliders.

If, however, the height of the object is greater than the knee location, a collision is possible. In this case, the height of the object may be set equal to the eye height as seen in block 214. The distance to the eye may then be computed as seen in block 216. Alternately, the horizontal distance may be determined. If this distance is within the boundary cylinder, the system records a collision and notifies other routines of the event as seen in blocks 218 and 220. Alternately, if the distance is not within the boundary cylinder, the system continues to test potential collision points.

Figure 15:
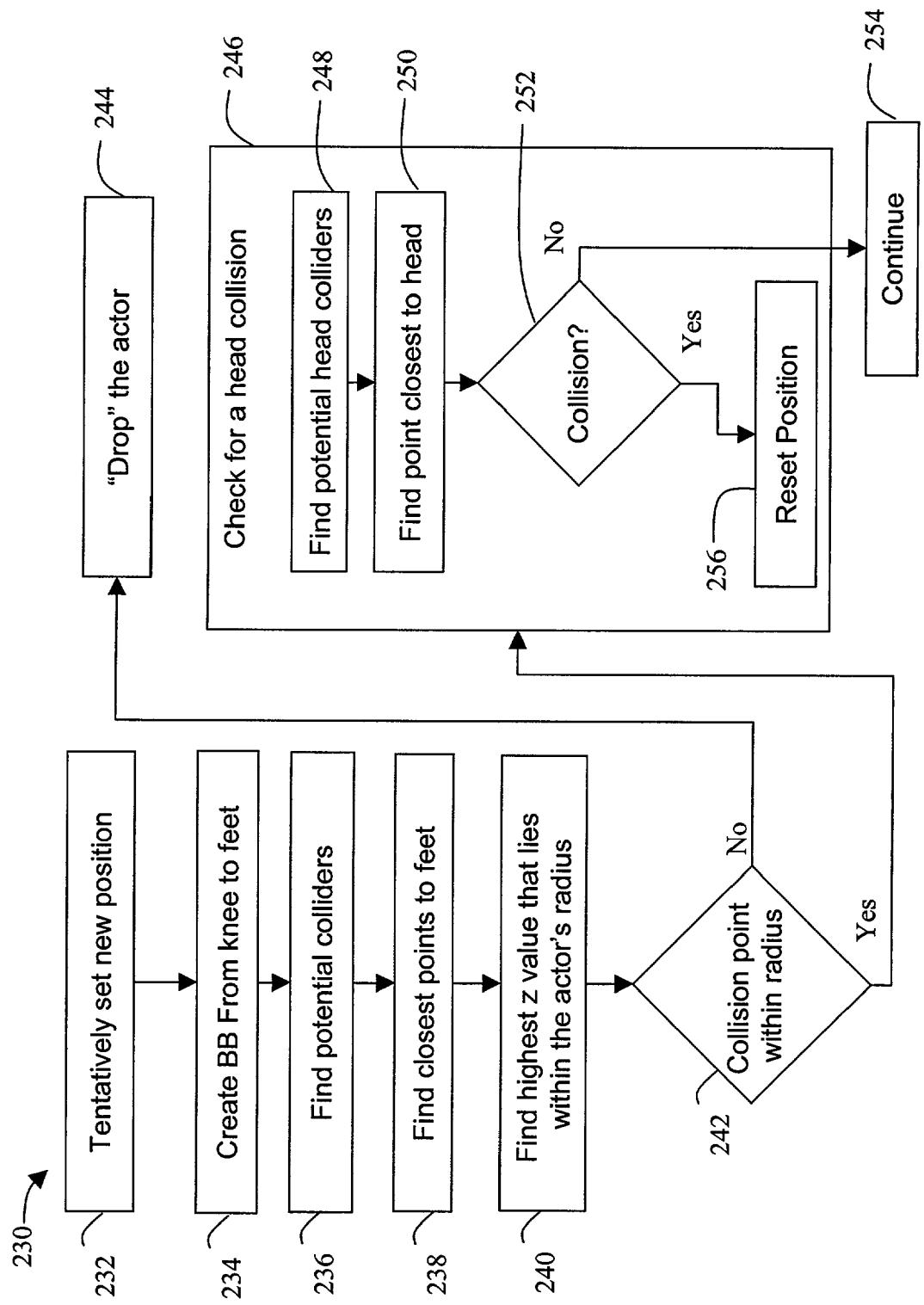
FIG. 15 is a block flow diagram depicting an exemplary method for use by the systems as seen in FIG. 1 and FIG. 2.

FIG. 15 depicts an exemplary method for planning a position as seen in block 189 of FIG. 13. In this exemplary method, the new position is tentatively set as seen in block 232. A boundary box is created from the knee to the feet to aid in determining potential objects that require climbing. The system then tests for potential colliders and finds those closest to the feet as seen in blocks 236 and 238. The system then determines the highest point within the radius of the actor as seen in block 240.

A test may be made to determine if an object is within the radius of the actor. If an object is, the actor may climb the object providing no head collisions occur. To test for head collisions, the model is tested for colliders about the head region as seen in blocks 248 and 250. Using the points closest to the head, the system tests for a collision as seen in block 252. If a collision occurs, the location of the actor is set to the previous location as seen in block 256. If no collision occurs, the program proceeds as seen in block 254. Proceeding may be accomplished by setting the vertical location of the lowest point on the actor equal to that of the highest point in the actor's radius.

If no objects are within the radius, the actor may be dropped. In some cases, the highest point at the new position may be below the previous vertical location. In this case the actor will move down. An algorithm may be established for dropping the actor to the new location. For example, the actor may be moved down by a body height of the actor for each frame or cycle through the calculations.

Figure 16:
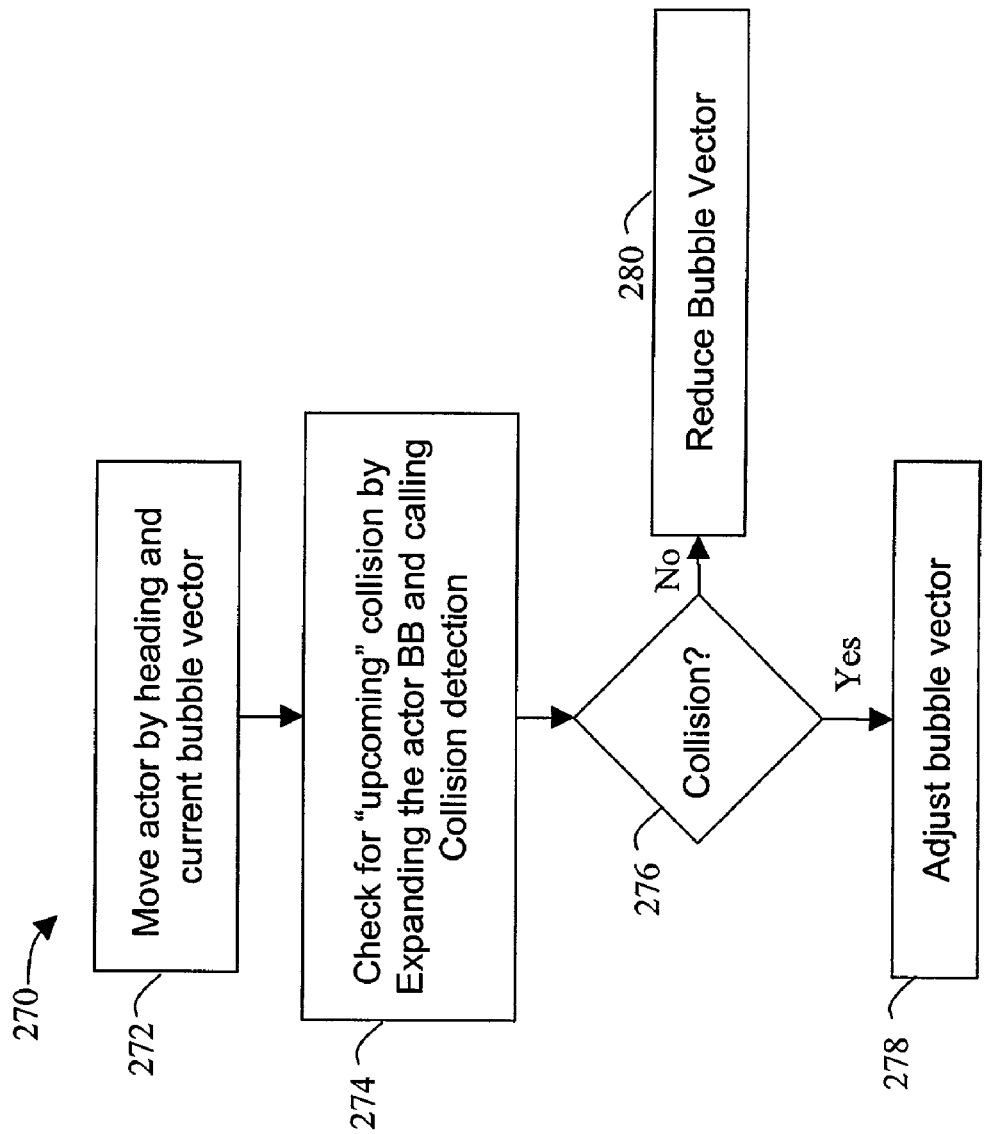
FIG. 16 is a block flow diagram depicting an exemplary method for use by the systems as seen in FIG. 1 and FIG. 2.

FIG. 16 depicts another method for providing movement and adjusting the bubble vector. In this method, the actor is moved in accordance with the heading and bubble vectors as seen in block 272. The bubble cylinder or boundary boxes are expanded to test for upcoming collisions as seen in block 274. If a collision is likely to occur, the bubble vector may be adjusted to prevent the collision as seen in block 278. However, if no collision is likely to occur, the bubble vector may be decreased as seen in block 280. The adjustment or decreasing of the bubble vector may be accomplished by changing the vector by a set amount, a percentage of the magnitude, or by a calculated quantity, among others.

Figure 17:
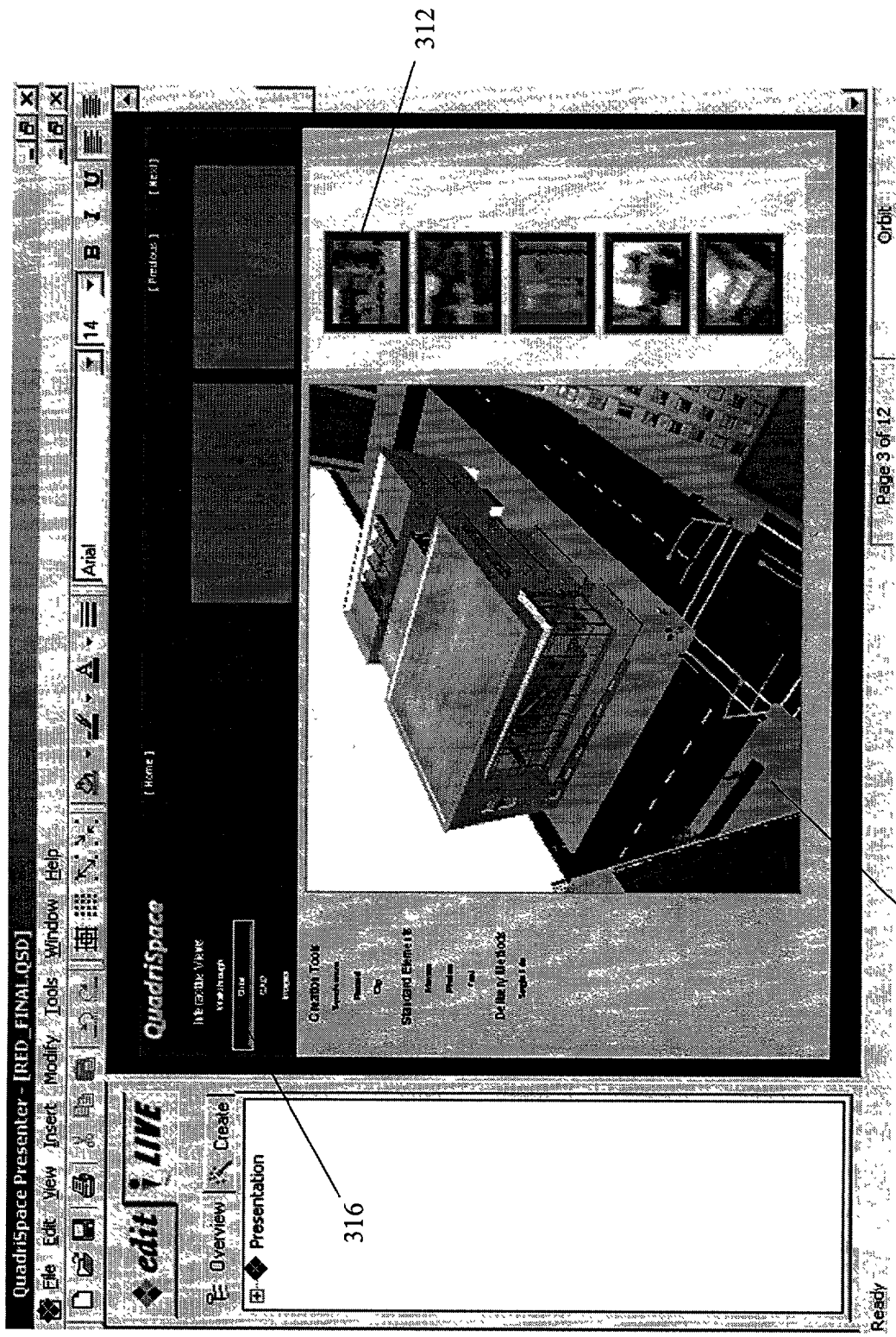
FIGS. 17 through 26 are pictorials depicting the system as seen in FIG. 1 and FIG. 2.
Figure 23:
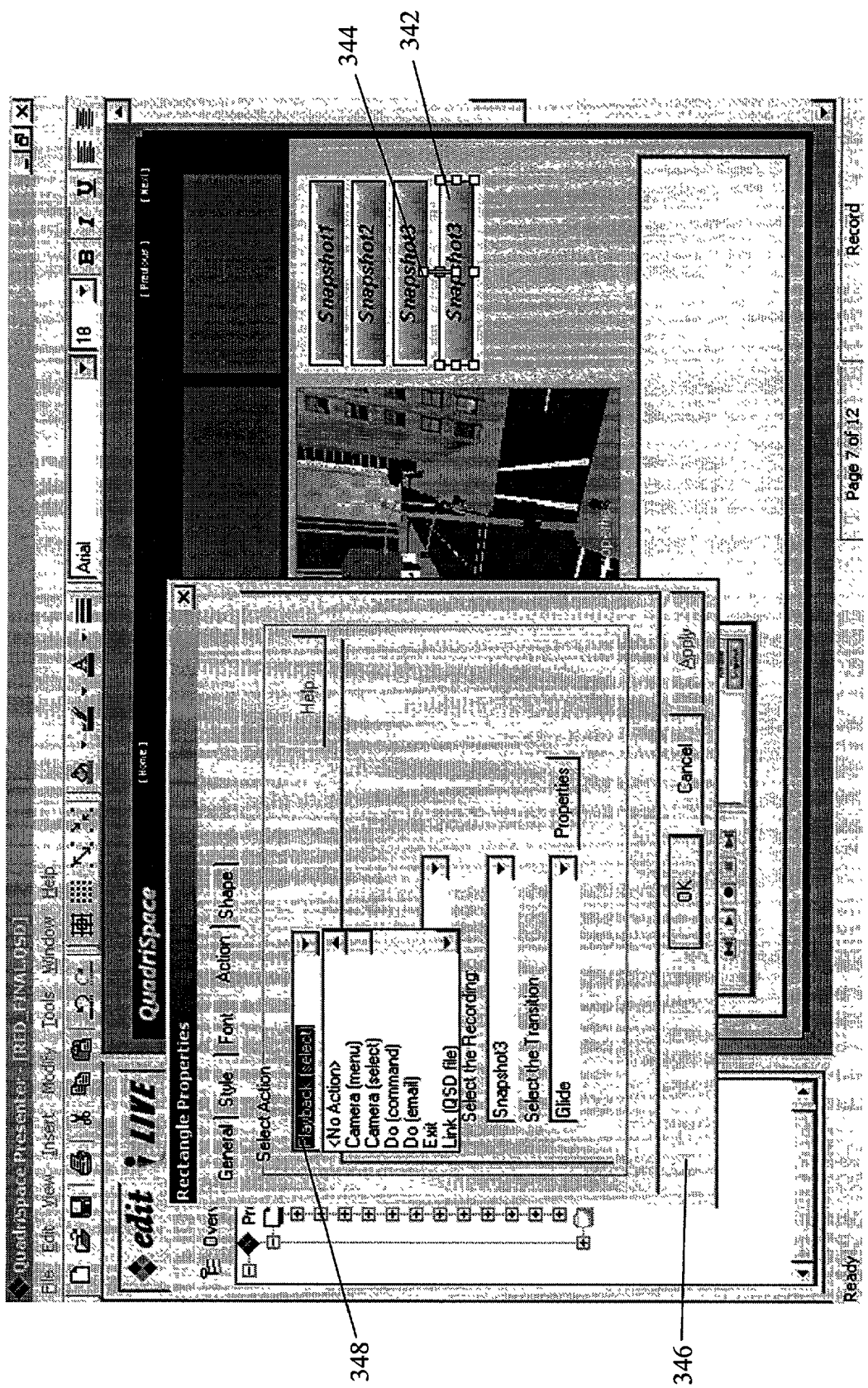

FIG. 17 depicts an exemplary embodiment of an orbit view 314. In this exemplary presentation, a page including the orbit view may be reached sequentially or through the selection of a button 316. The orbit view 314 may also be termed a third person view. The system permits buttons and various objects to manipulate other objects such as a view or vantage point within a third person view. In this example, a set of buttons 312 may be used to alter the orbit view object. Also, as will be discussed in more detail in relation to FIG. 23, buttons may have various characteristics such as mouse-over image swapping, and naming characteristics. Further, functionality may be associated with the buttons.

Figure 18:
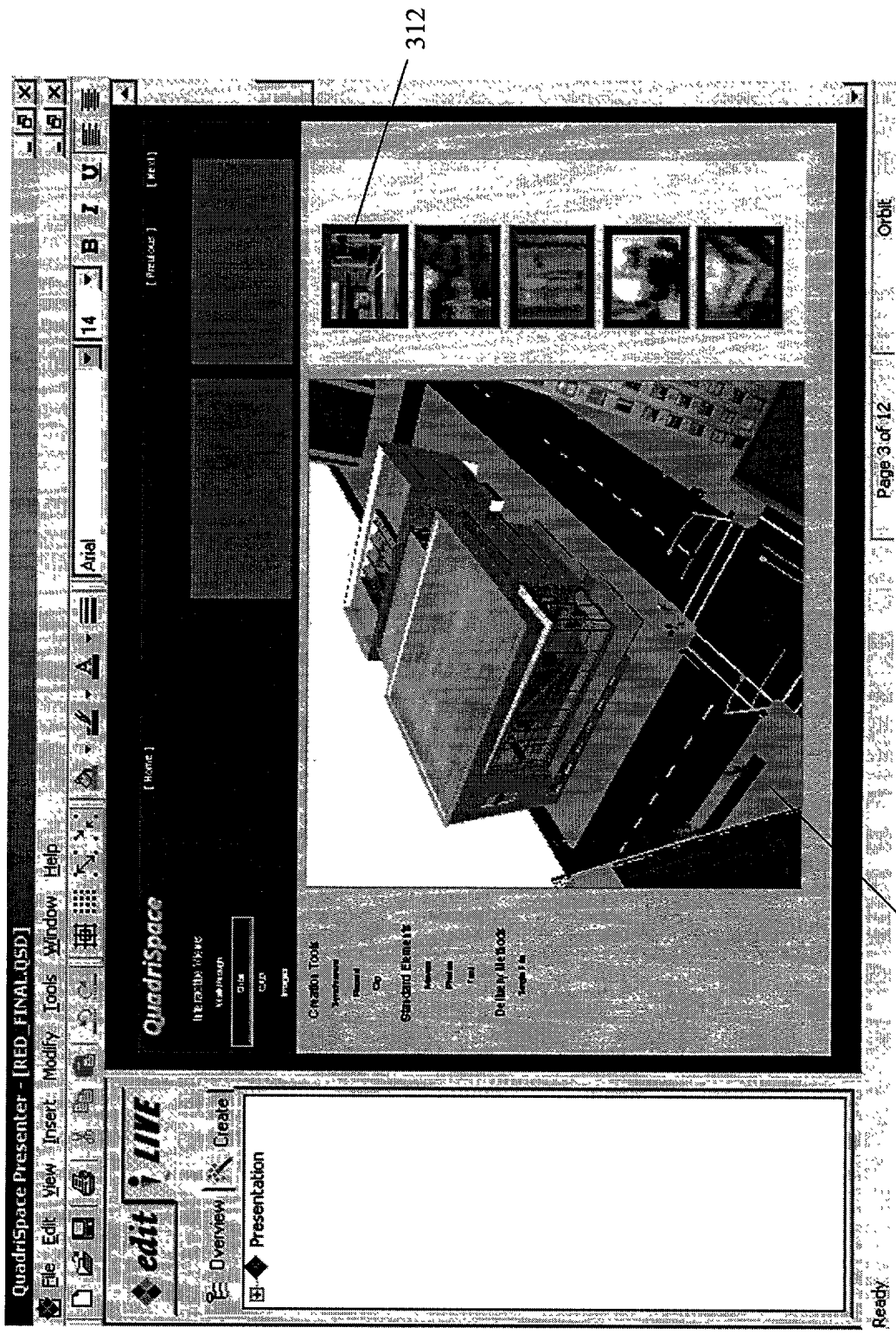
Figure 19:
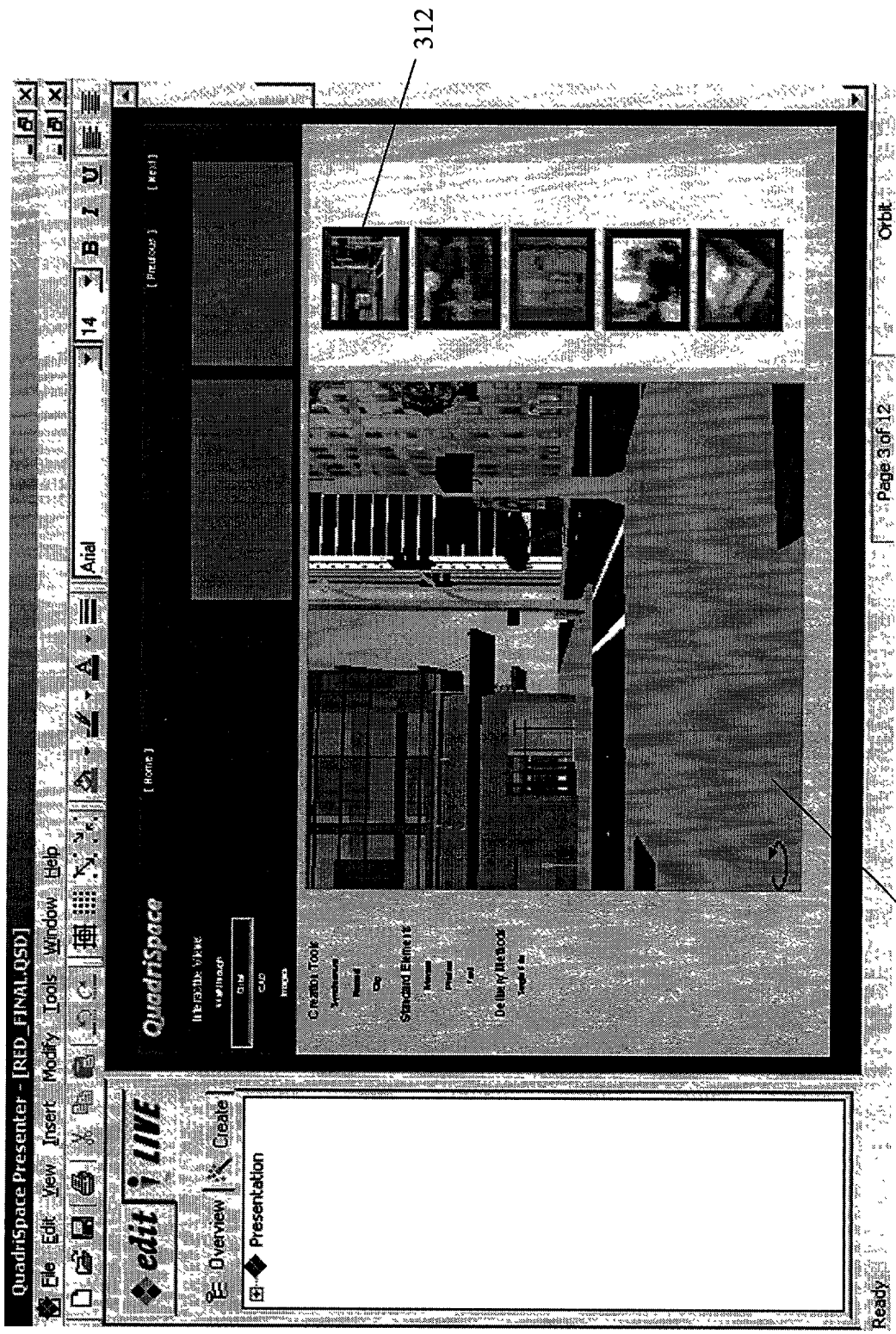

In this example, movement of a mouse over the button induces an image swapping. FIG. 18 shows the swapped image 312. In this case, the swapped image is a sharpened version of the blurred image seen in FIG. 17. Upon selection of the button, the view in the orbital view changes. FIG. 19 depicts the new orbital view. In this case, the new vantage point depicts an image similar to that of the button 312. However, various button appearances may be envisaged.

The orbital view may also be manipulated through mouse interactivity. For example, double clicking a mouse button may set a focal point for the orbital view and holding a mouse button while moving the mouse may facilitate orbiting about the focal point. The focal point may be selected by seeking a collider object indicated by the mouse pointer.

In orbital views, various visual appearances may be provided to transition between views. These transitional appearances may include, direct path translations, circuitous paths translations, accelerating or decelerating translations, slide, fade, spliced image translations, and three-dimensional effects, among others. However, various algorithms for transitioning between views may be envisaged.

Figure 20:
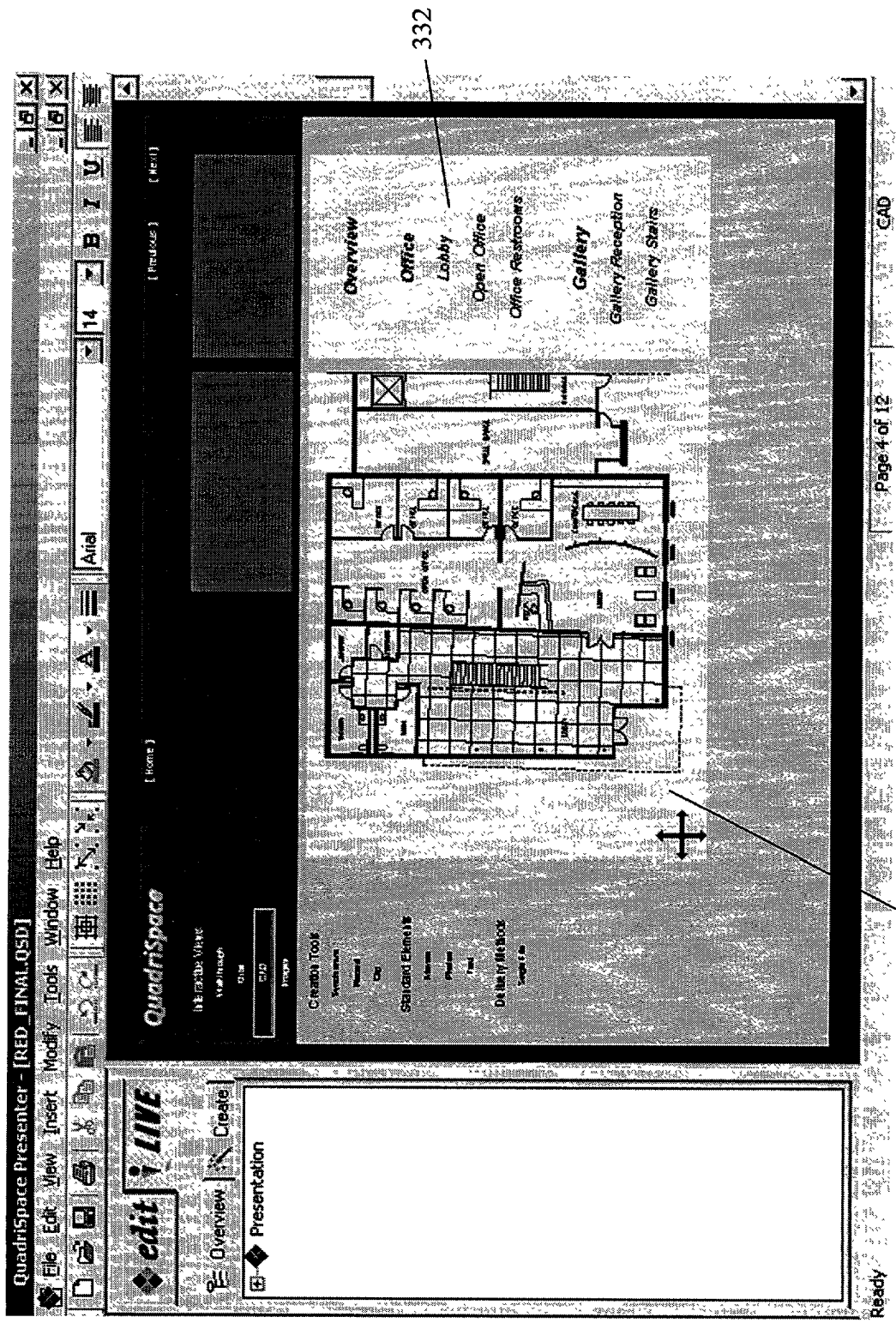
Figure 21:
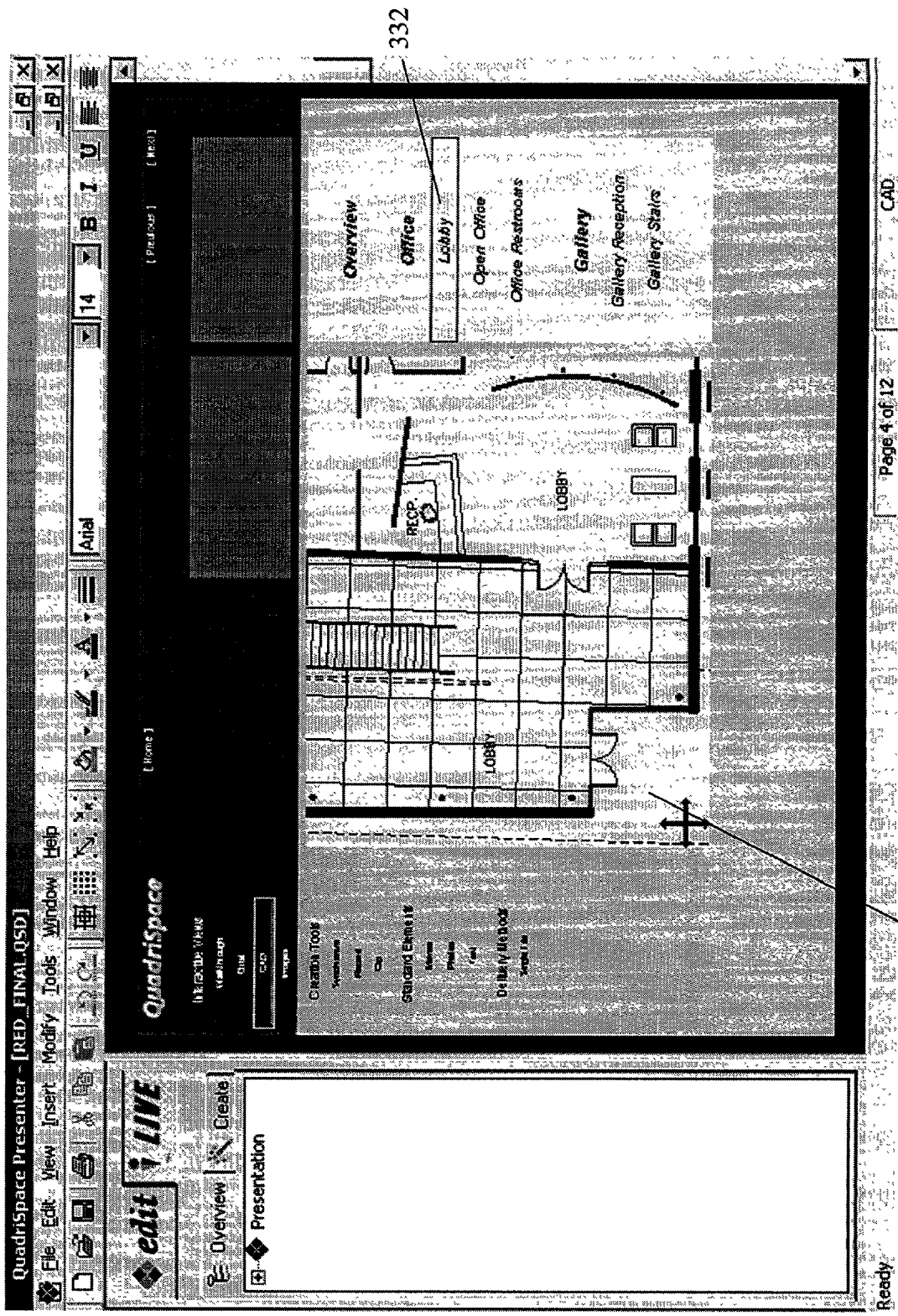

In another exemplary embodiment, a two dimensional object may be manipulated with a button or functional characteristics associated with text. As seen in FIG. 20, a two-dimensional object 334 may be arranged on a page. This two-dimensional object may be an image, vector drawing, or two-dimensional slice of a three-dimensional model, among others. If a button 332 is selected, the view of the two-dimensional object may be altered. For example, the system may pan or zoom to show a new vantage of the image. However, various manipulations may be envisaged. FIG. 21 depicts the visual appearance of the two-dimensional object. In this case, the button 332 denoting Lobby is selected and the two-dimensional object zoomed in on a specified view of the Lobby area.

Figure 22:
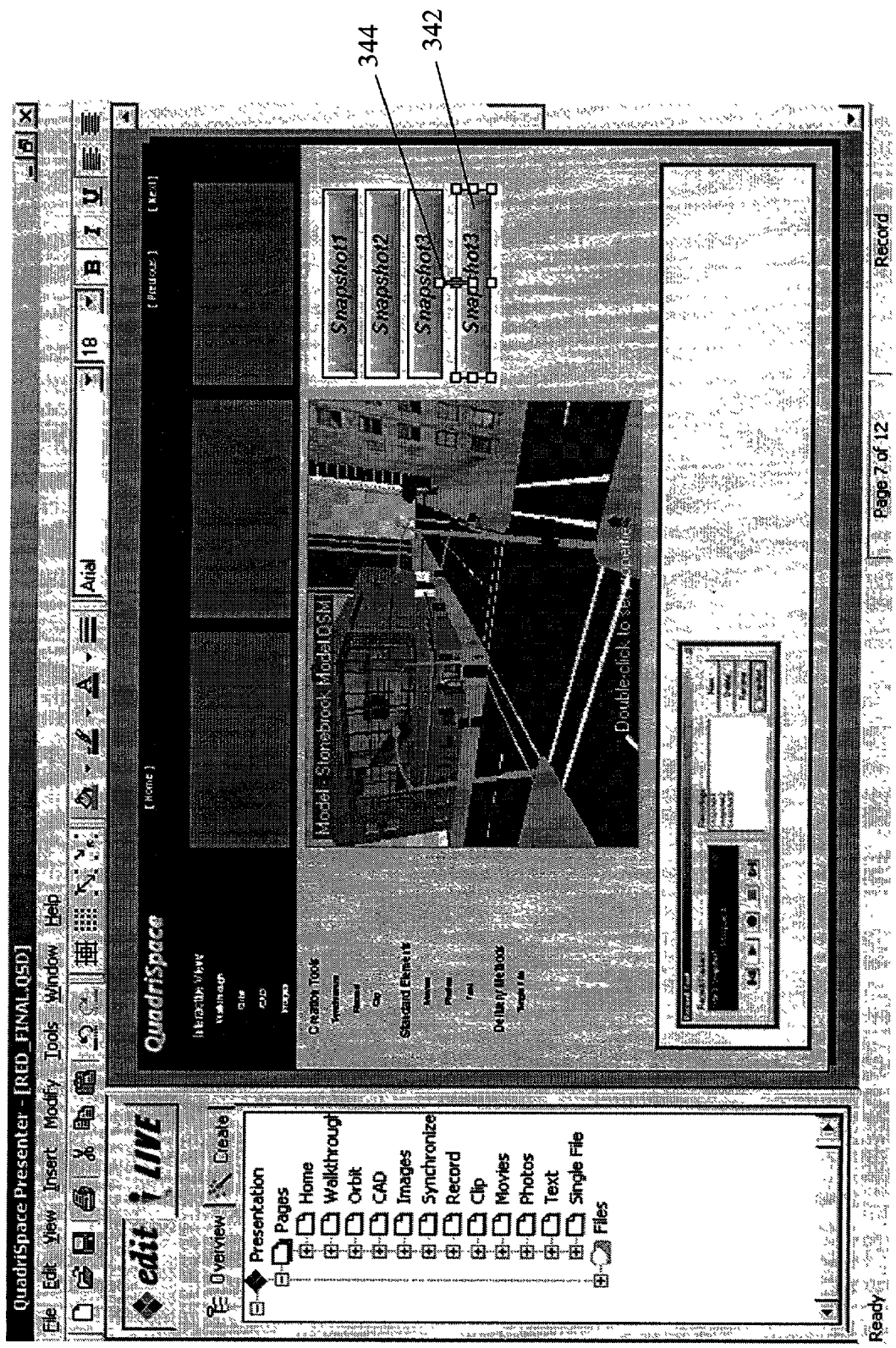

FIG. 22 depicts the placement of a button. In this case, the button 342 is a replica of another button. When inserted, the button 342 has a handle 344 extending vertically from a center point. This handle may be used to rotate the button. In addition, the button may be resized by manipulation of corner tabs associated with the button. Further, the properties of the button may be established in a properties panel 346. These properties may include visual appearance, size, location, lettering characteristics, name, shape, and associated functionality. In an action tab, functionality may be applied to the button 342 using a pull-down menu 348. In this exemplary embodiment, the functionality of the button may include enabling and manipulating camera selection, initiating commands, sending email, moving between pages, exiting the program, initiating another presentation, manipulating objects, and altering visual characteristics of objects, among others. These visual characteristics may include rendering characteristics (hidden line, photo realism, cartoon, watercolor, oil painting, motion blur, blur, noise, pencil, charcoal, map pencil), actor properties, terrain, changing parts, viewing position, viewing orientation, focal point, shadows, sky settings, lighting settings, camera angles, material characteristics (color, displacement map, reflectivity, transparency, reflection map, and texture) for three-dimensional objects; rendering characteristics (hidden line, photo realism, cartoon, watercolor, oil painting, motion blur, blur, noise, pencil, charcoal, map pencil), zoom, pan, sharpness, associated image or data, for two-dimensional objects; font, color, and size for text objects; color, shape, size, width, height, and thickness for lines and shapes; and transparency/opacity, visibility, motion, layer control, past transformations, size, position, orientation, location, color, shape, angle, mode, and meta data for all objects, among others. For example, a button may initiate a shadow for a specified time of day in a three-dimensional object. The chosen functionality may also affect the button characteristics. For example, the label text of the button may reflect the time of day for an associated shadow. In another example, the label of the text of the button may reflect a page to which the button directs the presentation. However, various functionalities may be envisaged in relations to various objects. Further, functionality may be introduced with the introduction of additional object types.

Figure 24:
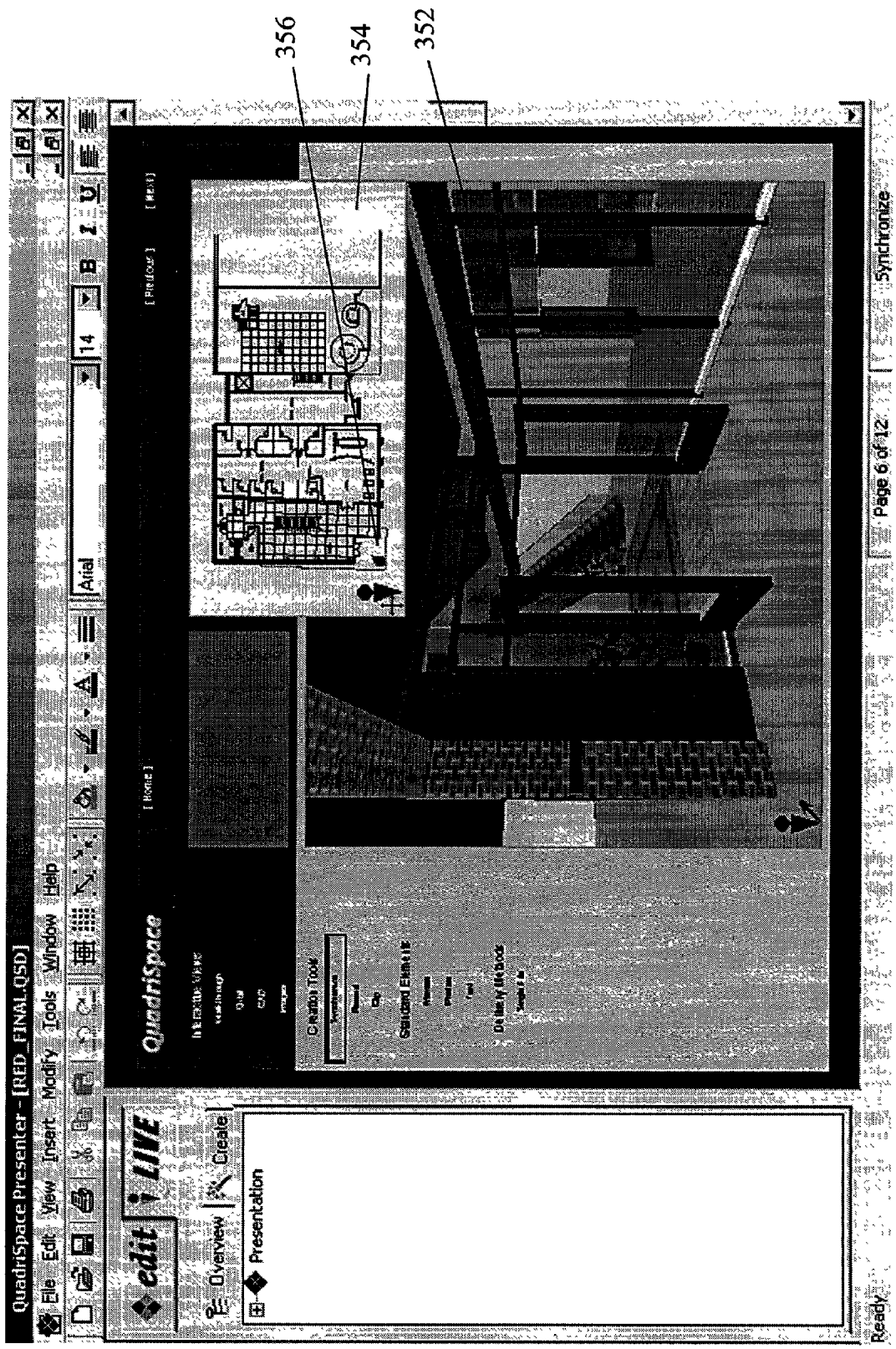
Figure 25:
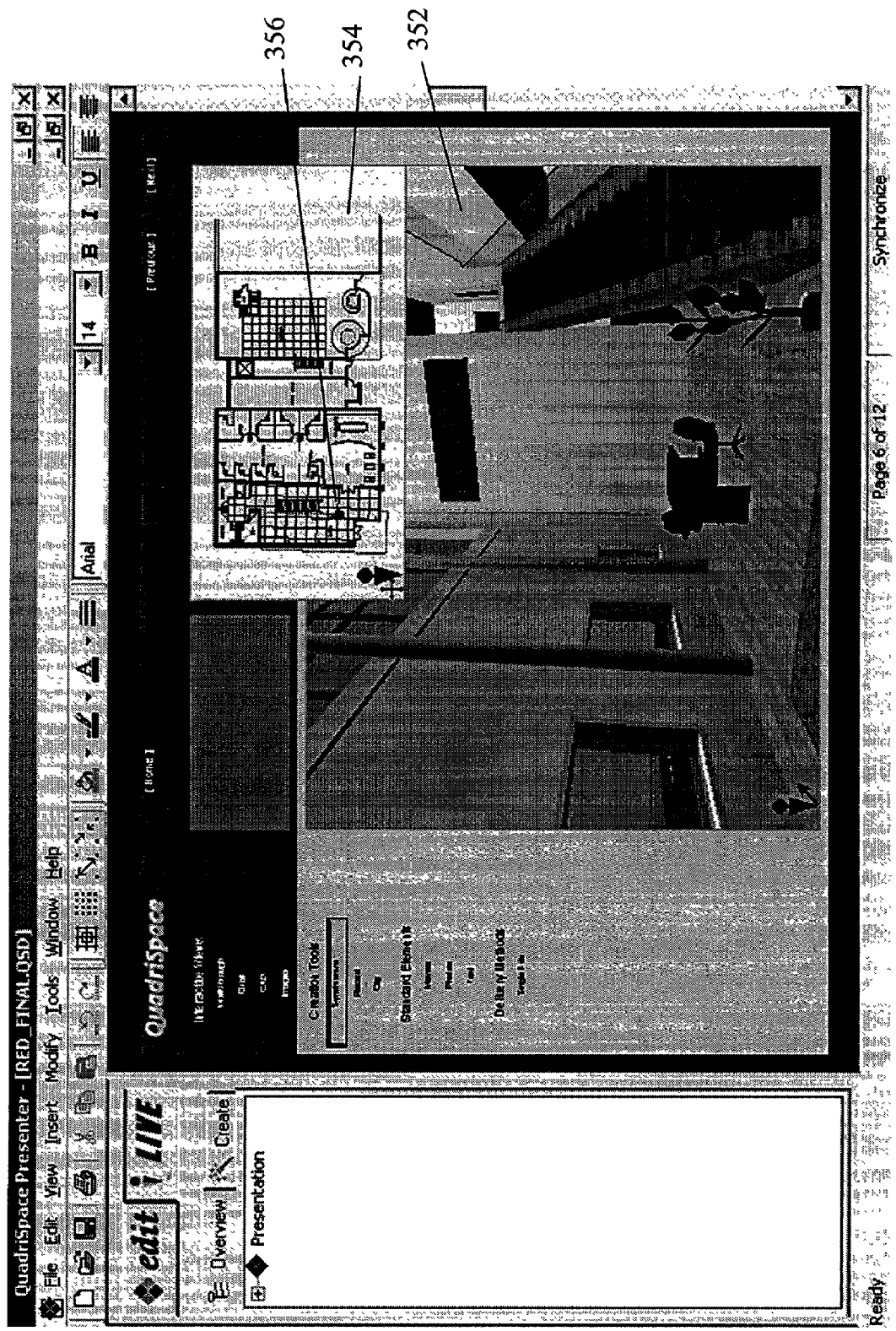

Another feature of the system is the synchronization between two data sets. FIG. 24 is an exemplary embodiment of a synchronization between a three-dimensional walkthrough 352 and a two-dimensional floor plan 354. On the two-dimensional floor plan is an icon 356 representative of an actor associated with the first person view of the walkthrough object. As seen in FIG. 25, if the view in the walkthrough is manipulated, for example, through advancing the actor, the position and indicated direction of the icon on the two-dimensional floor plan is altered accordingly. Similarly, if the icon were manipulated, the view in the walkthrough may be altered accordingly.

Figure 26:
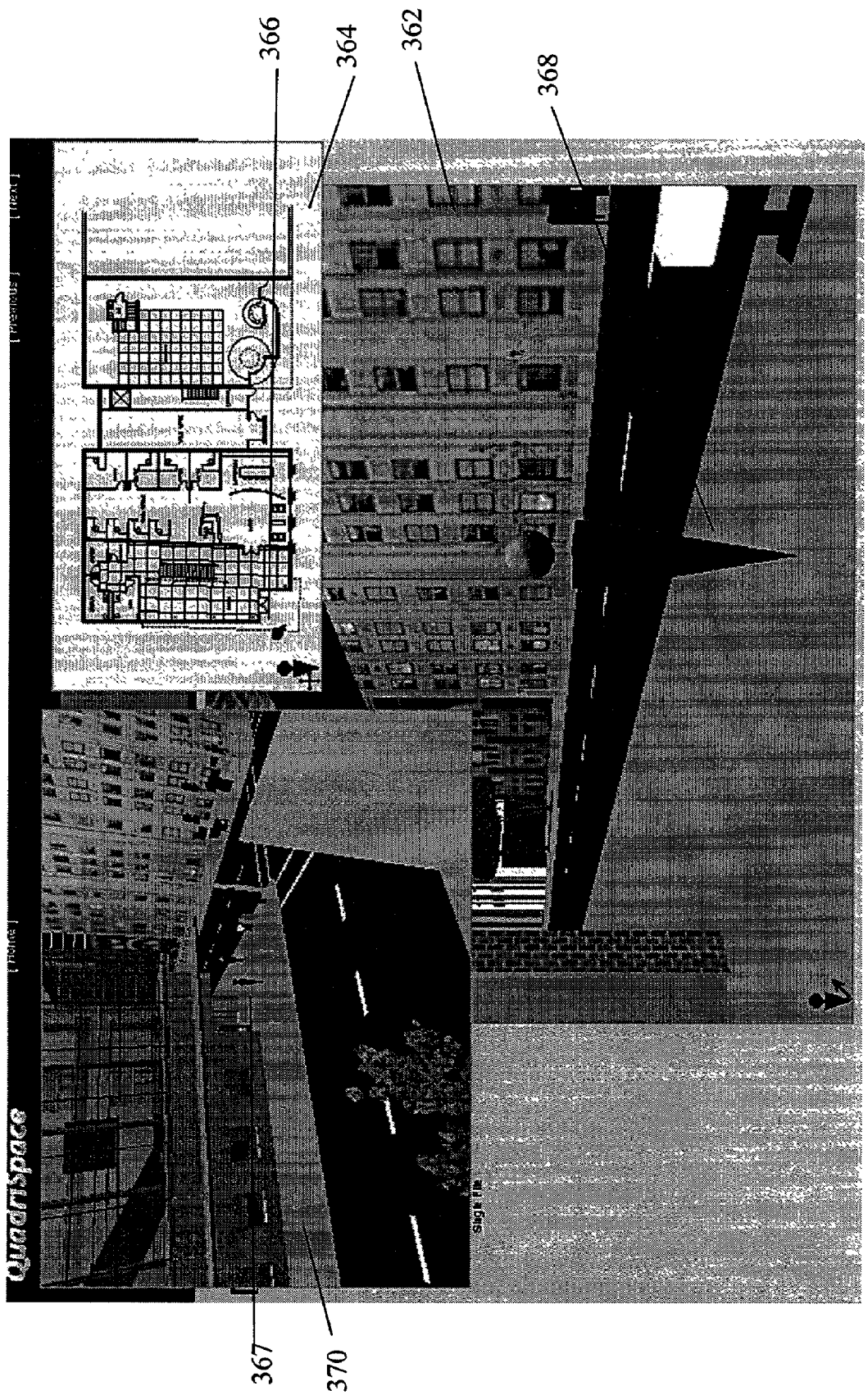

FIG. 26 depicts the addition of an orbital view. A walkthrough view 362 and two-dimensional object 364 are provided. The icon 366 is presented in the two-dimensional view in accordance with the position of the actor associated with the first person view. In addition, an orbital view 370 is provided which shows the first person actor 367. In this case, more than one object may be synchronized with another data set.

This example also depicts another actor 368. The system may permit multiple actors to be established. The first person system may jump from actor to actor and the other associated objects may react accordingly.

Other examples include synchronizing a two-dimensional aerial photo with a two-dimensional landscaping plan, a schematic drawing with a CAD data, and a three-dimensional graphic data of an empty house with a three-dimensional graphic data of a furnished house, among other. Further, the system may permit a transparent overlay of data on another data. For example, a transparent two-dimensional map over a three-dimensional graphic data. In another exemplary embodiment, a two-dimensional data may be synchronized and integrated within three-dimensional data. For example, a two-dimensional image or vector drawing of a landscaping may be integrated or synchronized with a three-dimensional data of a building. In this manner, two data sets may be synchronized and displayed in the same view. However, various embodiments and usages may be envisaged for synchronized data sets.

Figure 27:
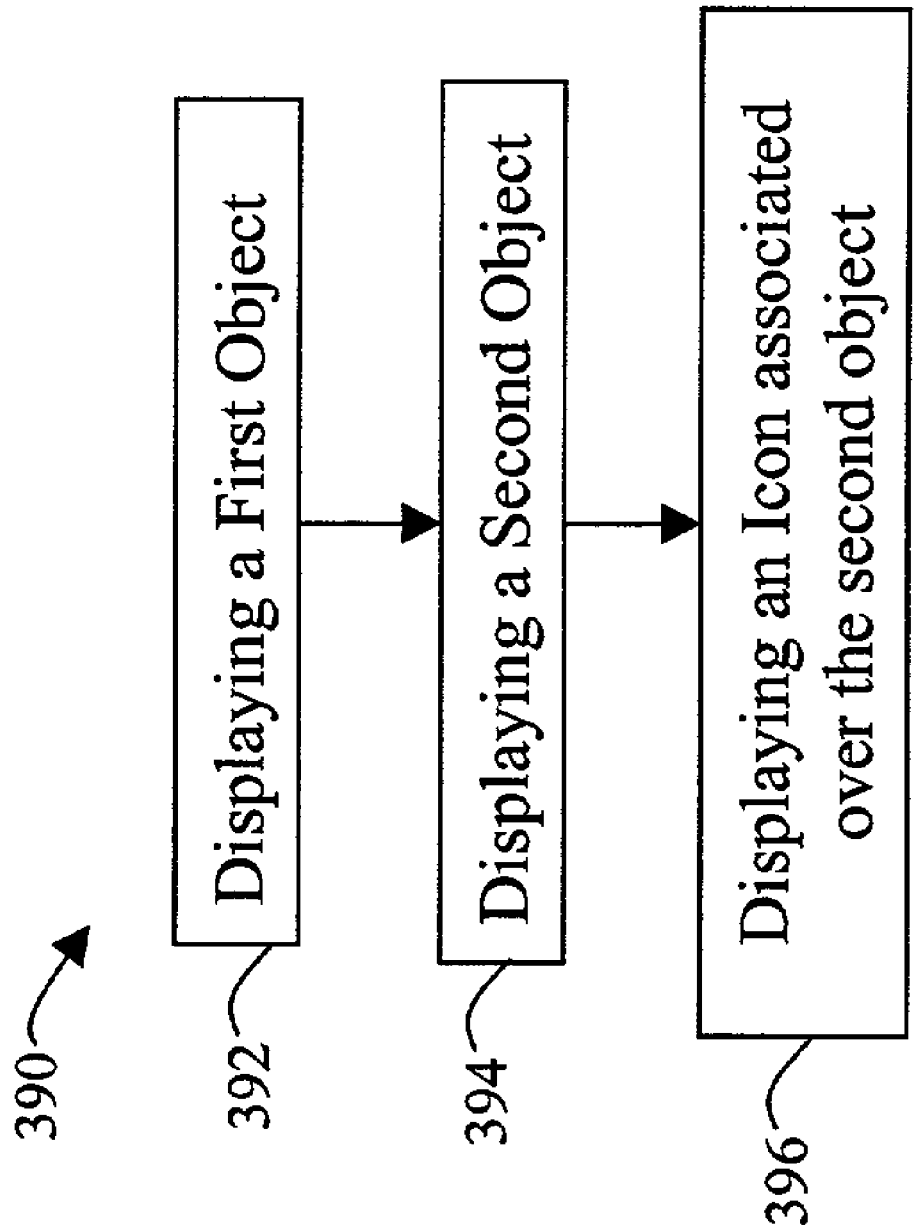
FIG. 27 is a block flow diagram depicting an exemplary method for use by the systems of FIG. 1 and FIG. 2.

FIG. 27 depicts an exemplary method for synchronizing data sets. In the method 390, a first data objects is displayed as seen in block 392. Similarly, a second data set is displayed as seen in block 394. An icon that corresponds with a position in the first data set is then displayed in the second data set as seen in block 396. In addition, for certain types of data sets, an icon may be displayed in the presentation of the first data set.

Figure 28:
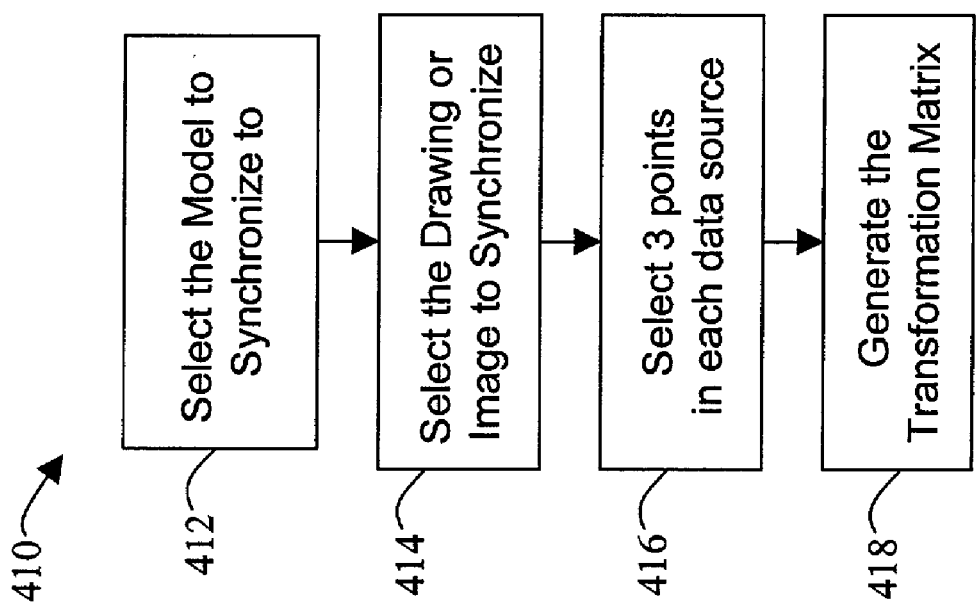
FIG. 28 is a block flow diagram depicting an exemplary method for use by the systems of FIG. 1 and FIG. 2.

FIG. 28 depicts an exemplary method for synchronizing data sets. In this method 410, a three-dimensional data set is synchronized with a two-dimensional data set. However, a similar method may be applied to synchronize two three-dimensional data sets or two two-dimensional data sets.

A three-dimensional data set is selected as seen in block 412. In addition, a two-dimensional data set is selected as seen in block 414. Three points in each data set are selected as seen in block 416. Each point corresponds with a data point in the other data set. A transformation matrix may be established that permits translation of coordinates between data sets as seen in block 418. In this manner, manipulations of one data set may be presented in a relation to a second data set. In addition, the system may permit swapping of data sets based on manipulation in one data set. For example, a floor plan image may be swapped based on vertical location of an actor in a walkthrough view. If the translation matrix occurs on a horizontal two-dimensional plane, the height dimension may be used to key image swapping and other visual characteristics.

Figure 29:
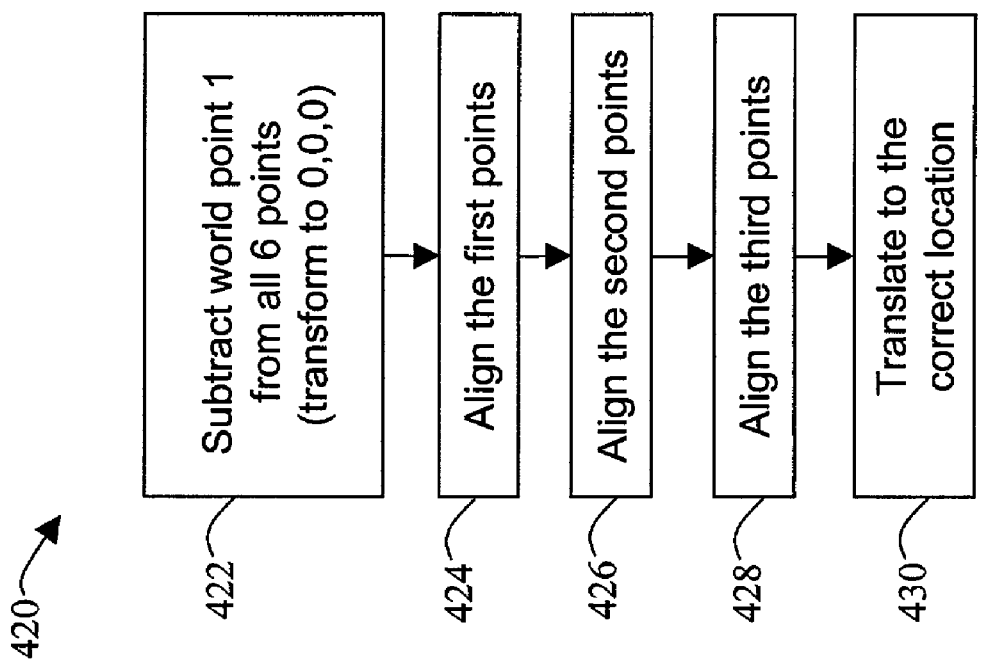
FIG. 29 is a block flow diagram depicting an exemplary method for use by the systems of FIG. 1 and FIG. 2.
Figure 30:
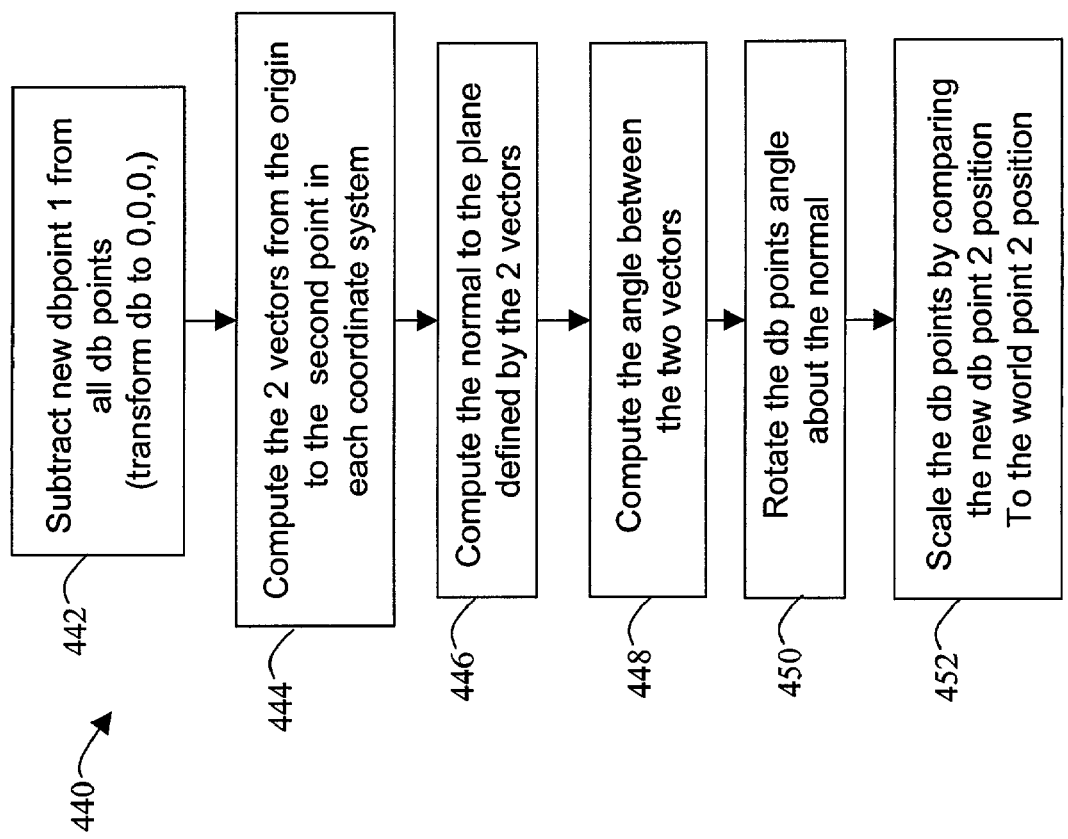
FIG. 30 is a block flow diagram depicting an exemplary method for use by the systems of FIG. 1 and FIG. 2.
Figure 34:
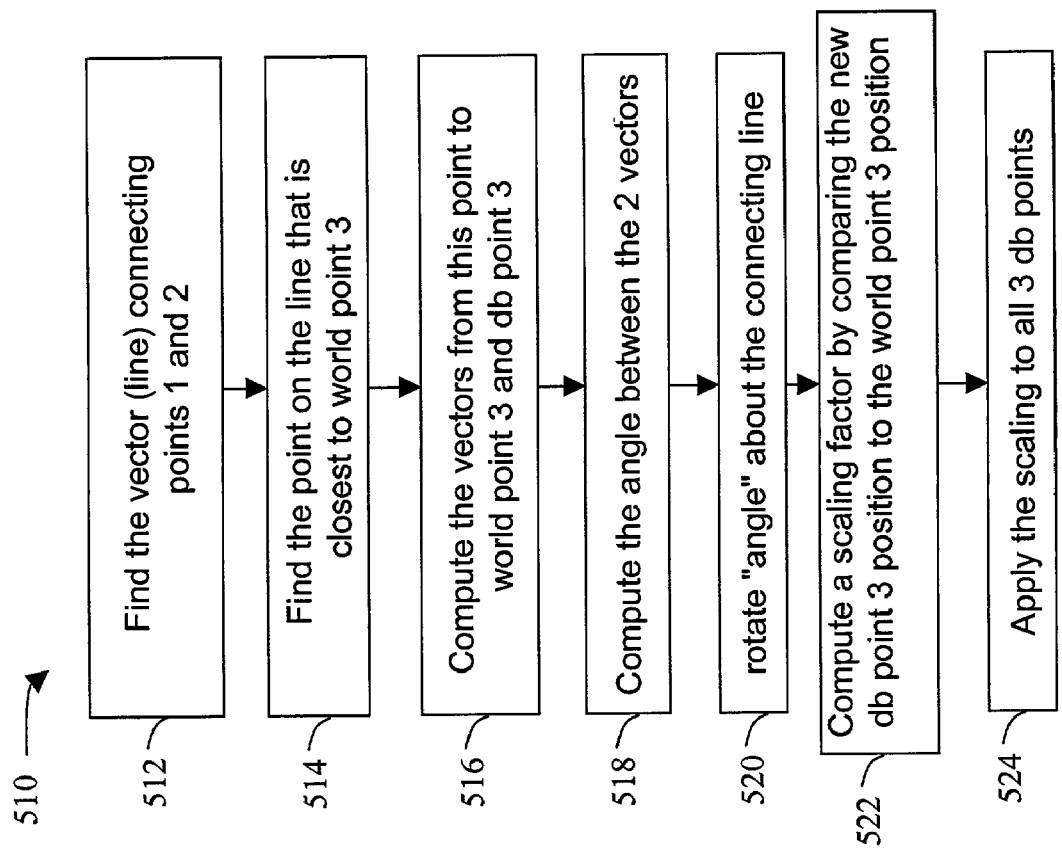
FIG. 34 is a block flow diagram depicting an exemplary method for use by the systems as seen in FIG. 1 and FIG. 2.

The transform matrix may be developed through the alignment of data points. FIGS. 29, 30, and 34 depict exemplary methods for building the transform matrix. In FIG. 29, the first point in the three-dimensional data is used as an origin point as seen in block 422. Using this new origin, the three points may be aligned as seen in blocks 424, 426, and 428. Using this alignment, the data may be translated as seen in block 430.

FIG. 30 provides more detail for aligning the first and second points. The first points in each data set are established as the origin points as seen in block 442. In this manner, they are aligned. To align the second points, vectors are calculated from the origin points to the two second points. These vectors define a plane. From the two vectors, the normal vector of the plane may be calculated as seen in block 446. An angle between the vectors is then calculated and the data sets are rotated about the normal vector to align the vectors as seen in blocks 448 and 450. Then, the vectors may be scaled to align the second data points as seen in block 452.

Figure 31B:
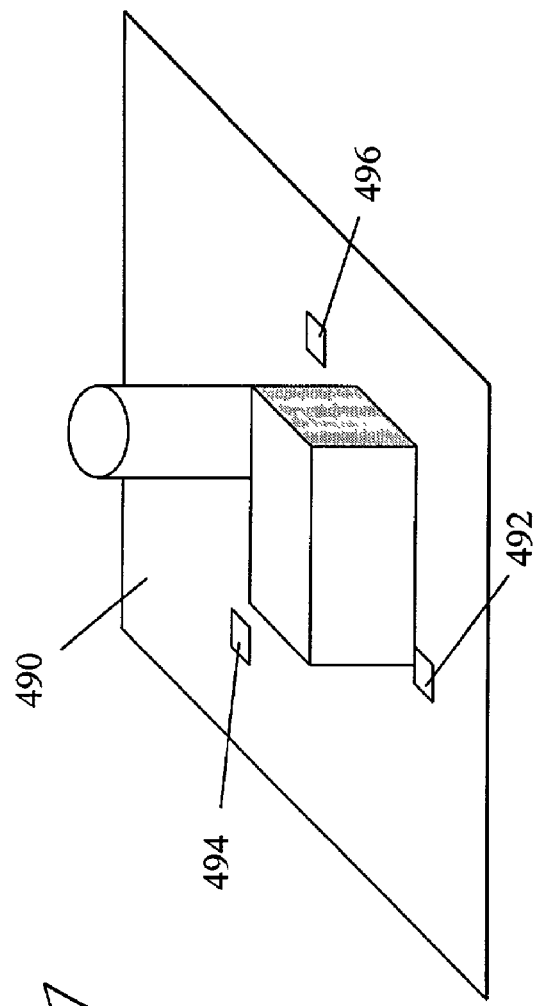
FIGS. 31A and 31B are schematic diagrams depicting an exemplary embodiment of two data sources.
Figure 31A:
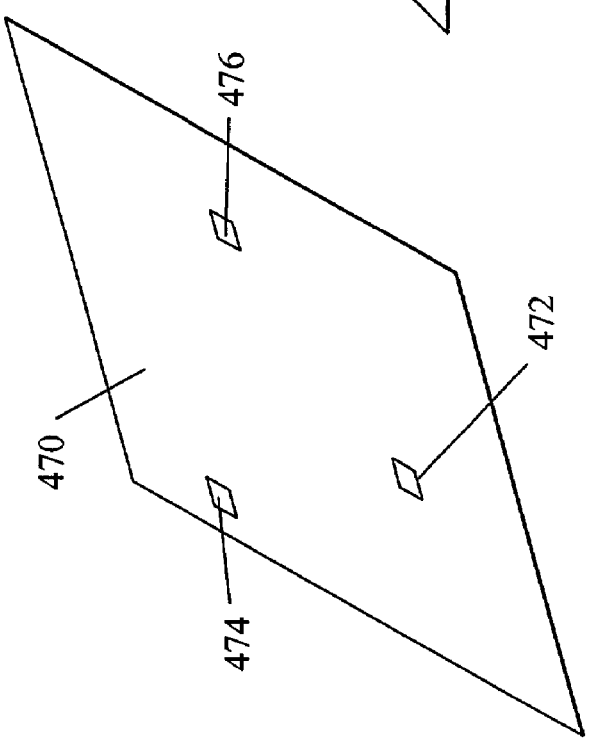

FIGS. 31A and 31B depict a pictorial of the two data sets. FIG. 31A depicts a two-dimensional data set 470 with a first 372, second 374, and third 376 data point. FIG. 31B depicts a three-dimensional data set 390 with a first 392, second 394, and third 396 data point.

FIGS. 32A and 32B depict the alignment of the first points of the data sets. FIG. 32A depicts the association of the first data points 372 and 392, respectively. Upon subtraction of the other points and establishment of the first points as the origin in each data set, the points are aligned as seen in FIG. 32B.

FIGS. 33A, 33B, 33C, 33D, and 33E depict the alignment of the second data points. Once the first points are aligned, the vectors to the second points may be determined as seen in FIG. 33A. The normal vector is computed as shown in FIG. 33B. Then, the angle between the vectors is determined as seen in FIG. 33C. At least one of the systems is then rotated about the normal vector, aligning the vectors as seen in FIG. 33D. The set may then be scaled to align the points as seen in FIG. 33E.

To align the third points, a new set of vectors may be determined and the system rotated and scaled in another dimensional or along another basis vector. FIG. 34 depicts an exemplary method for aligning the third points. In this method 510, the vectors between the first and second points are used as seen in block 512. The closest point along the vectors to the third points is determined as seen in block 514. Vectors are then calculated from this point to the third points as seen in block 516. The vectors will have an angle between them and form a normal vector in the direction of the vector between the first and second points. At least one of the data sets may be rotated and scaled to align the third points as seen in blocks 520 and 522. In this manner, the transform matrix may be determined as seen in block 524.

Figure 35B:
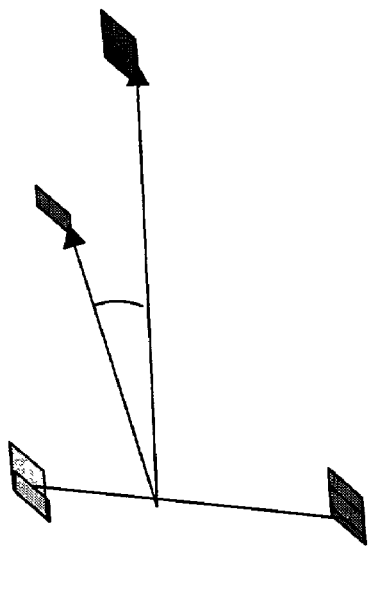
FIGS. 35A, 35B, 35C and 35D are pictorials depicting the alignment of a third set of points.
Figure 35D:
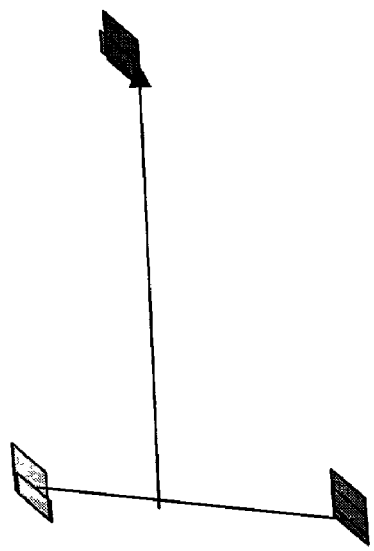
Figure 35A:
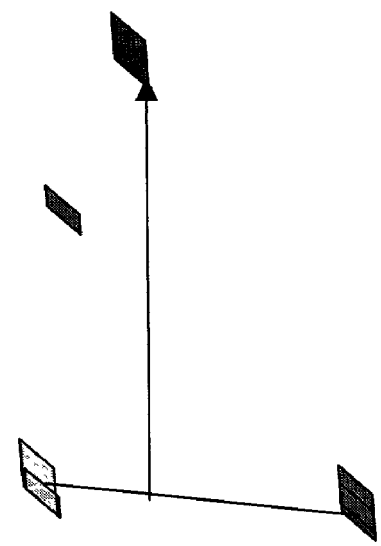
Figure 35C:
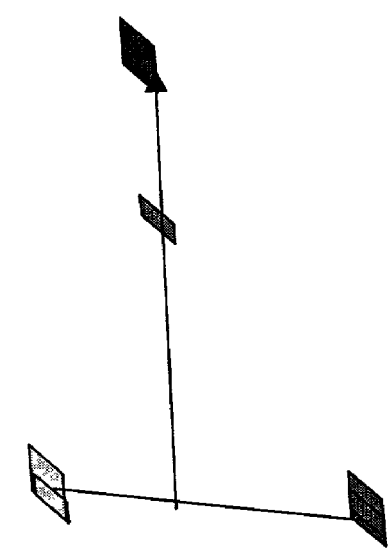

FIGS. 35A, 35B, 35C and 35D depict the alignment of the third data points. FIG. 35A depicts the determination of the vectors from the closest point on the lines between the first and second points to the third data points. FIG. 35B depicts the angle between the two vectors. Rotating about the vectors between the first and second points aligns the vectors as seen in FIG. 35C. Then, scaling aligns the points as seen in FIG. 35D.

In this manner, a transform matrix may be developed for synchronizing two data sources. These data sources may be two-dimensional or three-dimensional or a combination. In addition, another dimension may be used and tied to additional functionality such as image or drawing swapping, or orbital position changing, among others.

Figure 36:
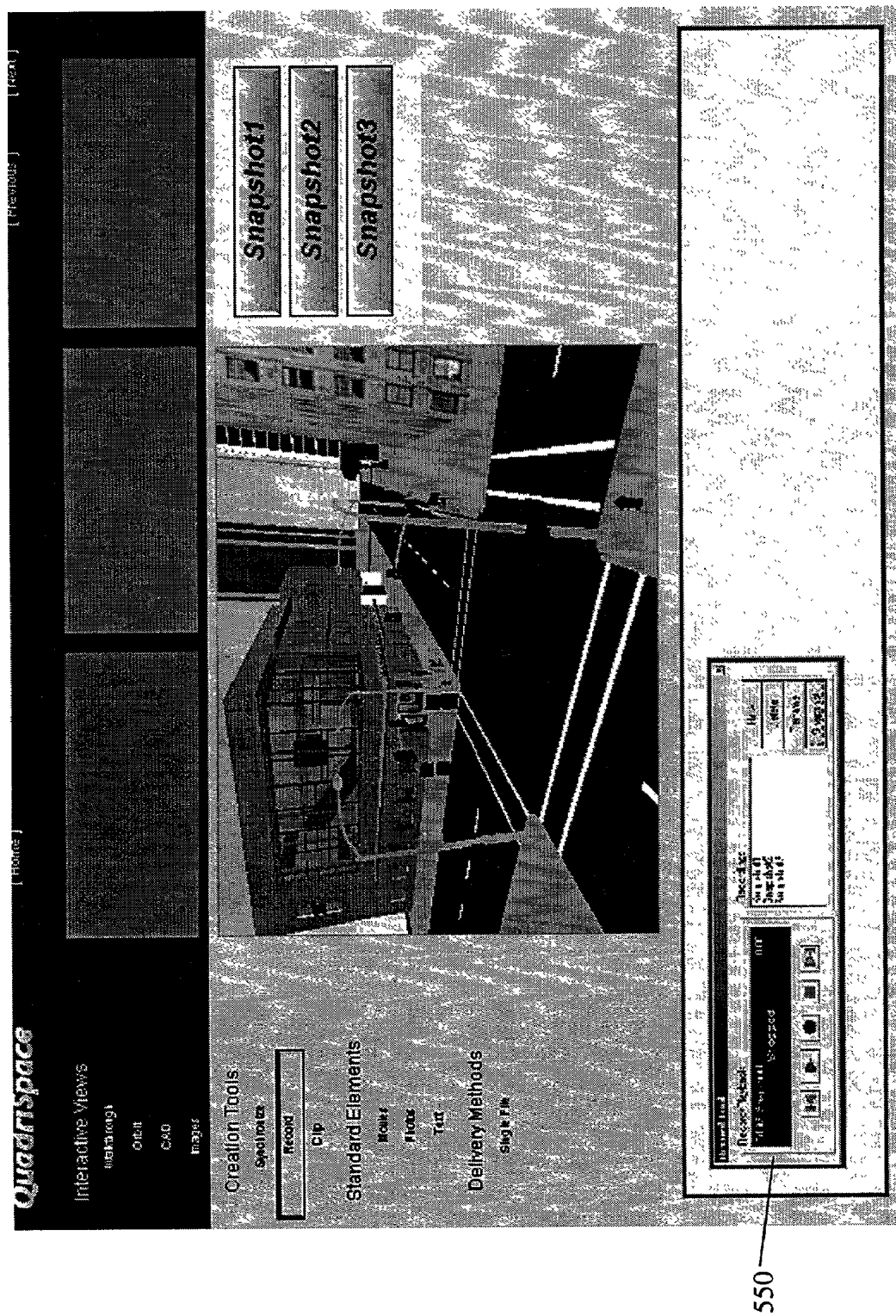
FIG. 36 is a pictorial depicting an exemplary embodiment of the system as seen in FIG. 1 and FIG. 2.

The system may also include various specialty tools. One example of these tools is the recording tool. FIG. 36 depicts the recording tool 550. The recording tool may be used to record a series or sequence of events. In this example, the recording tool may record a sequence of orbital views. These views may be tied to button functionality. Further, the activation of the replay of the sequence may be tied to buttons. If this embodiment of a recording were to be replayed, the orbital view would change through a series of vantage points, transitioning with a specified algorithm or visual appearance. However, various events and uses for a recording tool may be envisaged.

Figure 37:
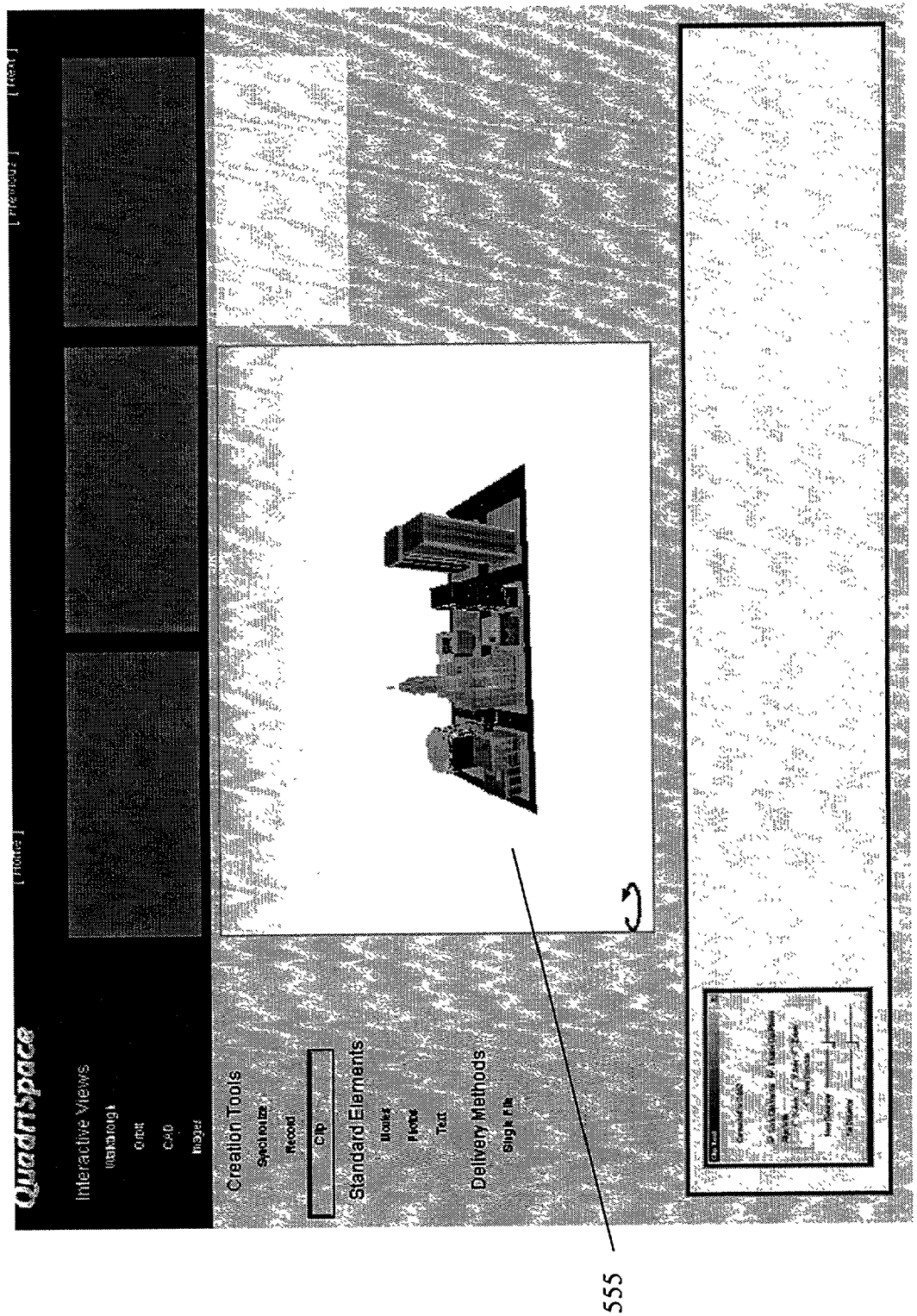
FIG. 37 is a pictorial depicting an exemplary embodiment of the system as seen in FIG. 1 and FIG. 2.
Figure 38:
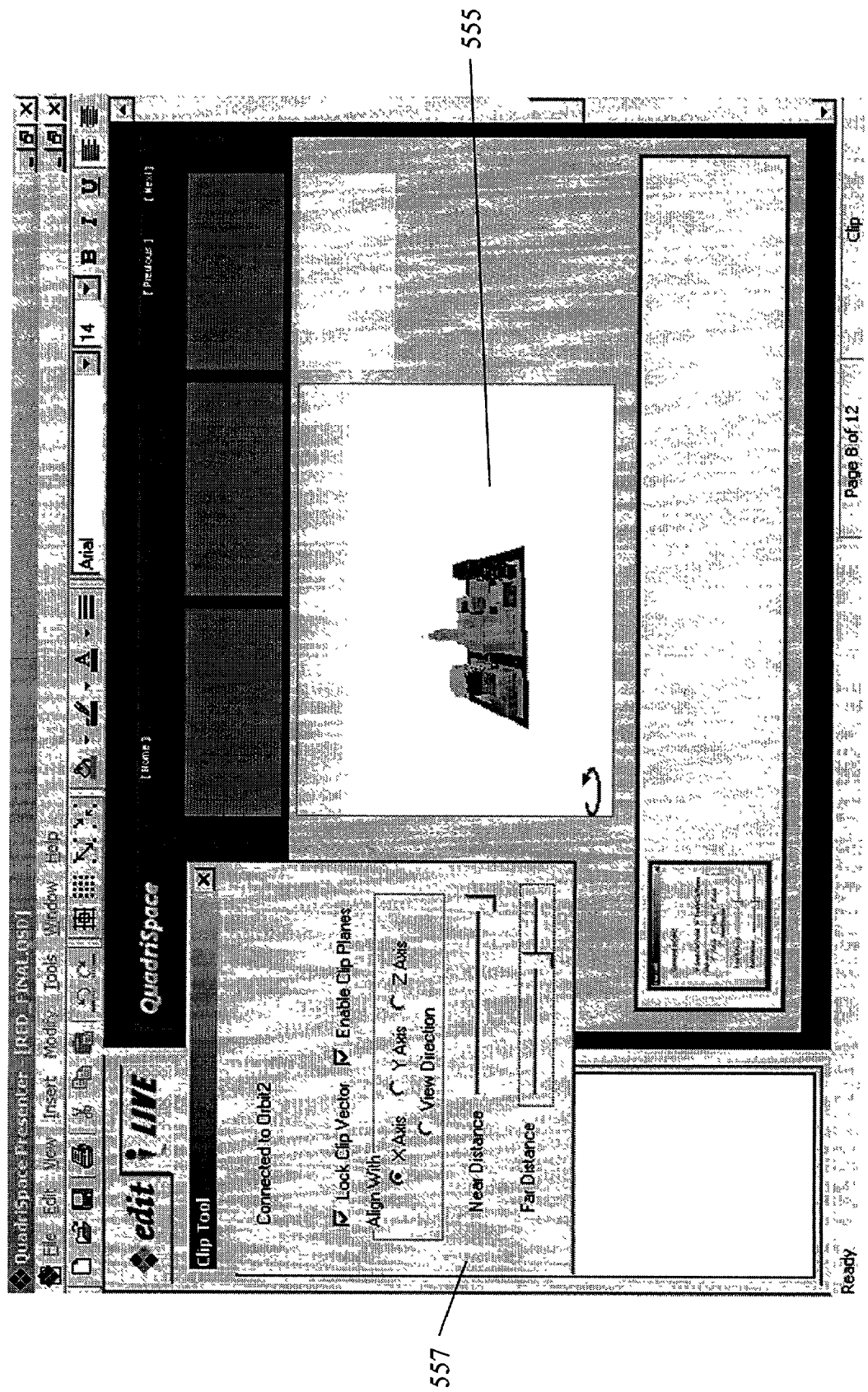
FIG. 38 is a pictorial depicting an exemplary embodiment of the system as seen in FIG. 1.

Another exemplary tool is a clipping tool. The clipping tool may clip or remove a part of an image or data set. In an exemplary embodiment, a three-dimensional data set 355 is presented in FIG. 37. Activation of the clipping tool as seen in FIG. 38, effectively removes a city block from the three-dimensional data set 355. However, the clipping tool may be used to dissect buildings, CAD objects, and images, among others. Further, the clipping tool may be used along any plane.

Figure 39:
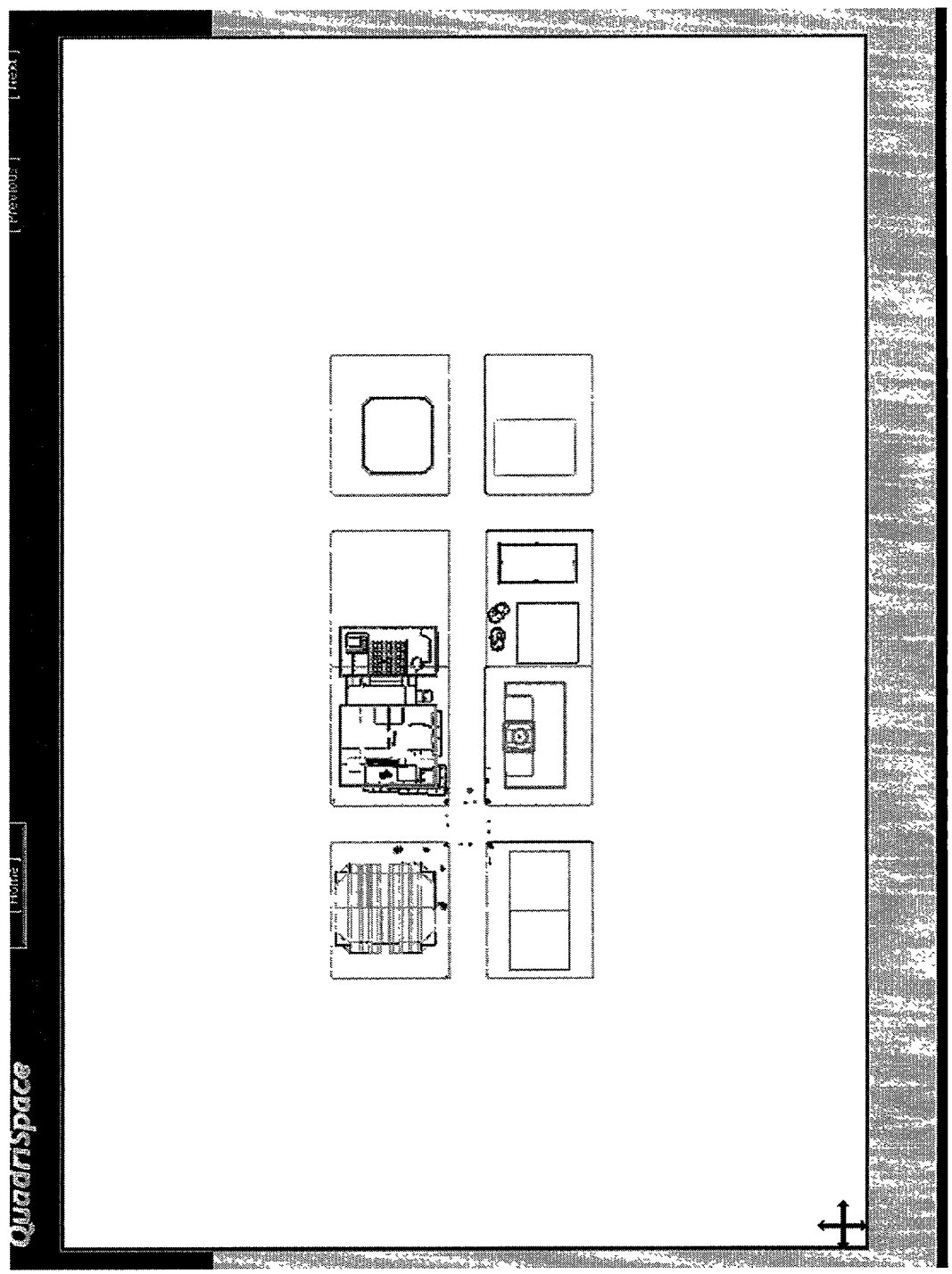
FIG. 39 is a pictorial depicting an exemplary embodiment of the system as seen in FIG. 1.

A similar visual effect may be seen in the sectional object. The section object provides a floor plan-like or schematic-like view of some features in three-dimensional data set. An example of the sectional view may be seen in FIG. 39. The sectional view object shows the substantially vertical walls of the model seen in orbital view 555 in FIG. 37.

Figure 40:
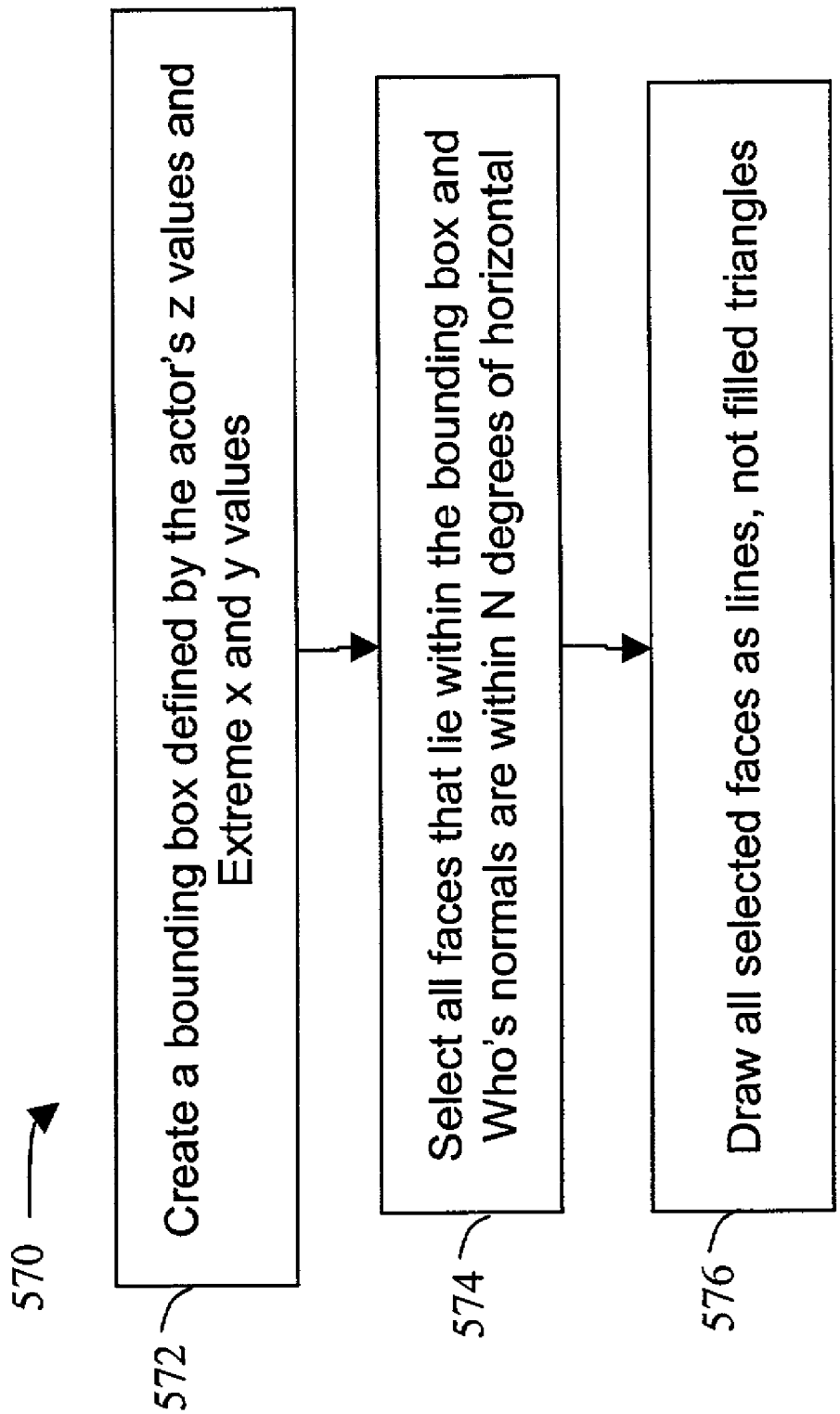
FIG. 40 is a block flow diagram depicting an exemplary embodiment for use by the systems as seen in FIG. 1 and FIG. 2.

FIG. 40 depicts an exemplary method for creating sectional views. In the method 570, a bounding box is created using the actor's vertical values and the extreme x and y values of the object. The system then selects all faces that lie within the box and whose normal vectors are within a specified degree from horizontal. This effectively finds all walls and vertical surfaces with some allowance for angled walls and nearly vertical surfaces. The system then draws these surfaces as lines and not filled triangles as seen in block 576.

Figure 41:
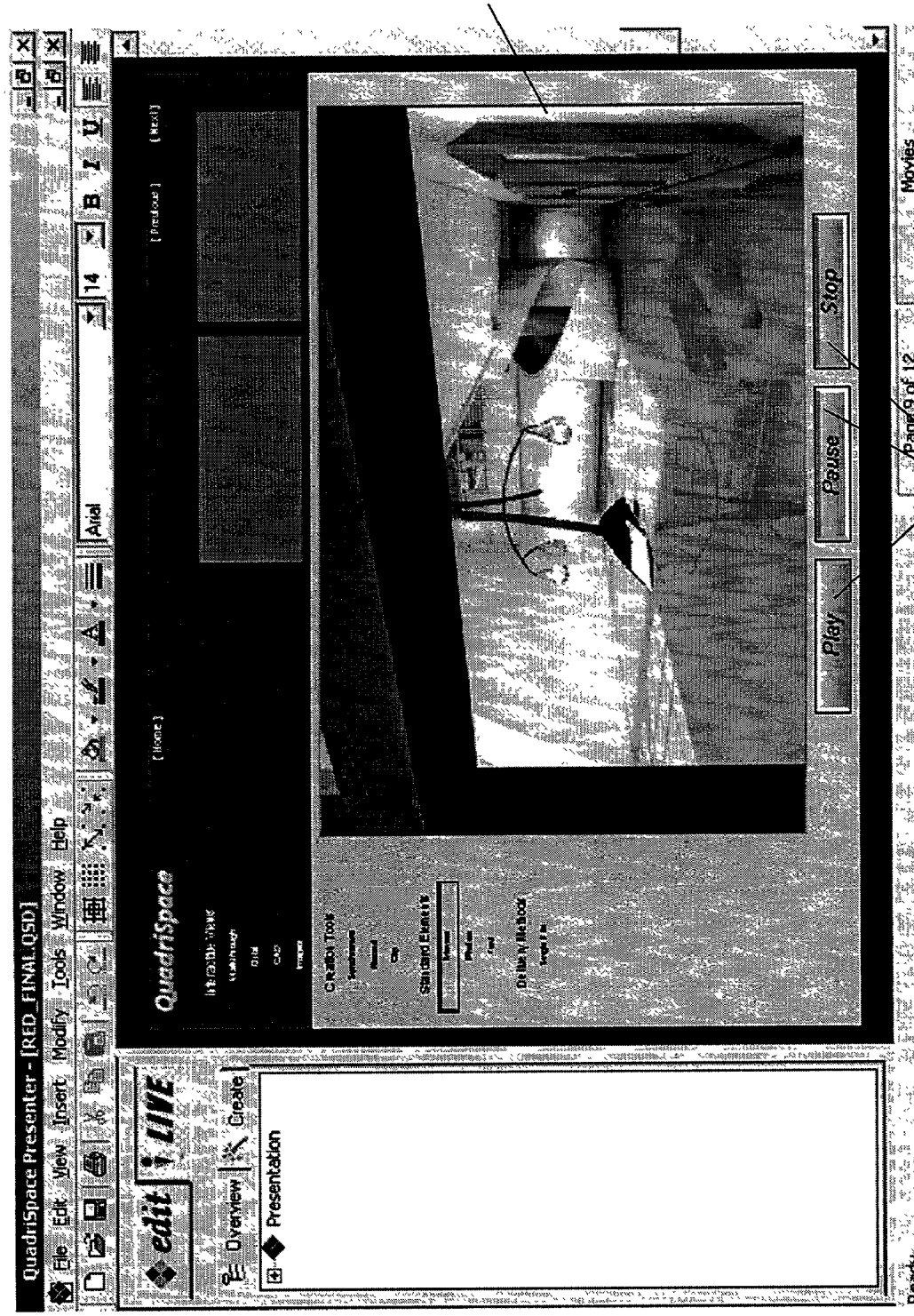
FIG. 41 is a pictorial depicting an exemplary embodiment of the system as seen in FIG. 1.

Other objects may be inserted into a page of the presentation tool. These objects may include movies 590 as seen in FIG. 41. Further, these objects may be controlled by buttons 592 and objects within the presentation.

Figure 42:
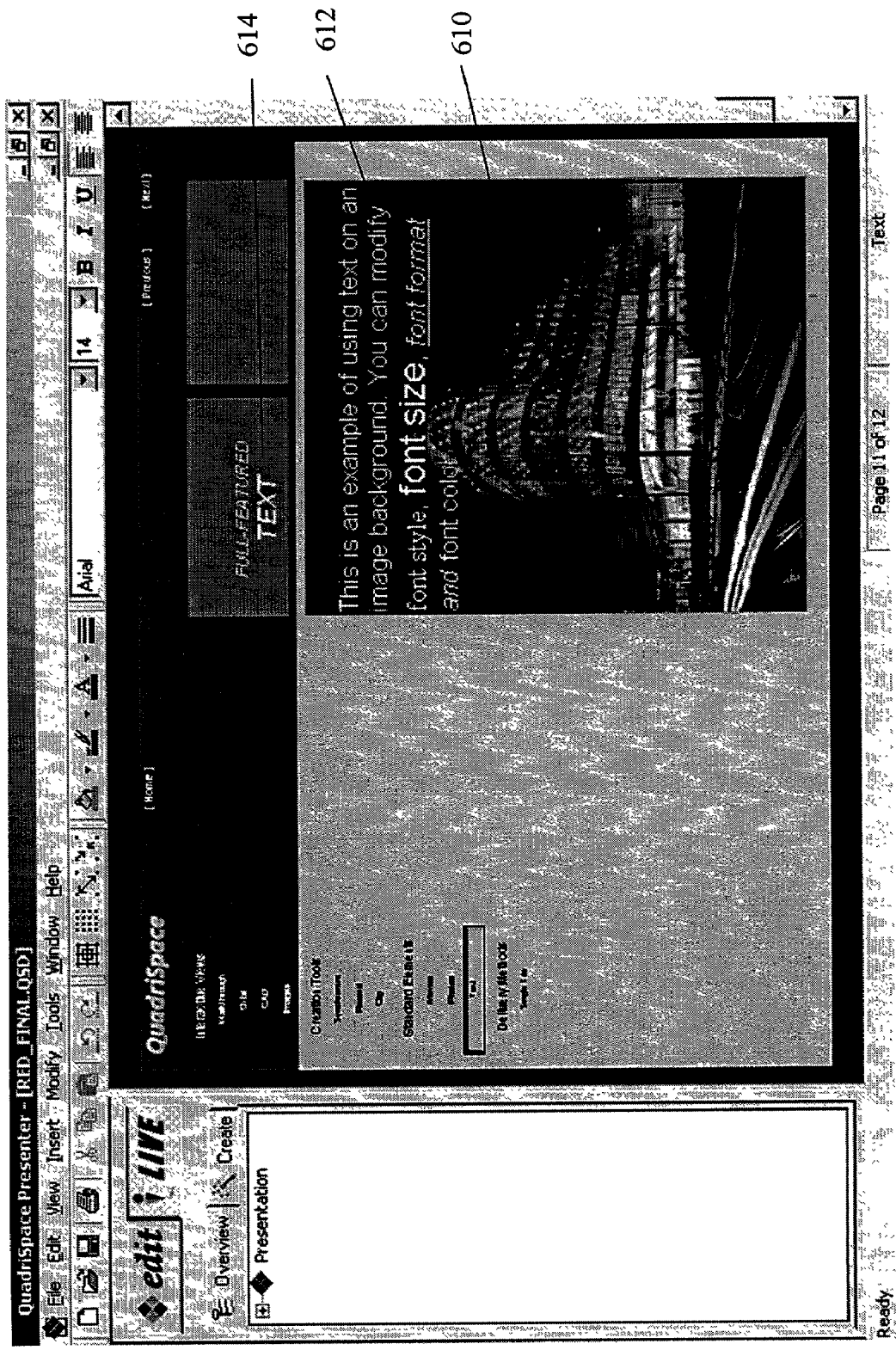
FIG. 42 is a pictorial depicting an exemplary embodiment of the system as seen in FIG. 1.

The system may also permit text objects to be placed over image and three-dimensional objects. For example, a text object with a transparent background 612 may be placed over an image object 610 as seen in FIG. 42. In other embodiments, the text object may be placed over three-dimensional objects and interactive two-dimensional objects. Further the visual characteristics of the text may be programmed to change in accordance with user interaction with an associated object.

As such, a system and method for displaying three-dimensional data is described. In view of the above detailed description of the present invention and associated drawings, other modifications and variations will now become apparent to those skilled in the art. It should also be apparent that such other modifications and variations may be effected without departing from the spirit and scope of the present invention as set forth in the claims which follow.

What is claimed is:

1. A presentation tool for creating, editing, interacting with and displaying a two-dimensional page based presentation in a computer system wherein the presentation comprises:
   an ordered sequence of at least one two dimensional pages, at least one of which two-dimensional pages contains at least one user definable object associated with a three dimensional model and operable for manipulating a view of the three dimensional model;

a second user definable object located about the at least one two-dimensional page functionally coupled to the at least one object associated with the three-dimensional view;

the location, appearance and functionality of the at least two objects on the at least one two-dimensional page being user configurable and part of the resulting presentation or document and not part of a user interface;

the at least two objects incorporating the information and functionality for interpretation in either a creation tool or a viewer; and the at least two objects on the at least one two-dimensional page being associated with separate independent data sources.

2. The presentation tool of claim 1, wherein manipulation of the at least one object associated with the three dimensional model results in a change in a visual characteristic of the second object.

3. The presentation tool of claim 2, wherein the second object is a two dimensional image.

4. The presentation tool of claim 2, wherein the at least one object associated with the three dimensional model is a first person walkthrough view of the three dimensional model and the second object is an orbital view of the three dimensional model.

5. The creation tool of claim 2, wherein all pages, objects and data sources that comprise the presentation or document are combined into a single operable file.

6. The presentation tool of claim 5, the presentation tool further comprising: instructions for creating a presentation package comprising viewer instructions, at least one user defined operable file, and at least one three-dimensional model.

7. The presentation tool of claim 1, wherein manipulation of the second object results in a change in a visual characteristic of the at least one object associated with the three dimensional model.

8. The presentation tool of claim 1, the presentation tool further comprising at least one user definable button located on the at least one page, the at least one button programmable to manipulate visual characteristics of objects.

9. The presentation tool of claim 8, wherein the at least one user definable button is programmable to manipulate a vantage point view of the three dimensional model.

10. The presentation tool of claim 8, wherein the at least one user definable button is programmable to manipulate an area of view of a two dimensional image.

11. The presentation tool of claim 1 the presentation tool further comprising at least one text object and the at least one two-dimensional page operable to superimpose text on other objects on the at least one two-dimensional page.

12. The presentation tool of claim 11, wherein manipulations of the at least one object on the at least one two-dimensional page alter the visual characteristic of the text on the at least one two-dimensional page.

13. The presentation tool of claim 1, the presentation tool further comprising: the ability to switch between an edit mode during which object properties may be edited; and a live mode during which a user may use the functionality defined by the properties of the objects on the at least one at least one two-dimensional page.

14. The presentation tool of claim 1, the presentation tool further comprising: instructions for accessing one or more external operable libraries, the one or more external libraries operable to extend the functionality of the creation tool.

15. The presentation tool of claim 1, the presentation tool further comprising: instructions for ignoring unknown objects when reading an operable file without losing the functionality of other objects in the file.

16. The presentation tool of claim 1, the presentation tool further comprising: instructions for pan and zoom features for manipulating a two-dimensional object on the at least one two-dimensional page.

17. The presentation tool of claim 1, the presentation tool further comprising: instructions for controlling the display of an operable file at one physical location from a remote physical location across a network.

18. The presentation tool of claim 1,the presentation tool further comprising: instructions for presenting a two-dimensional data superimposed on top of a three dimensional data within an object on the page.

19. The presentation tool of claim 1, wherein the at least one object is a user controlled walkthrough view with an automatic detection of collisions with objects in the 3D scene.

20. The presentation tool of claim 1, wherein the at least one object and the second object reference different data sources and are synchronized using a transform matrix such that a location in one data source can be mapped to the corresponding location in the second data source.

21. The presentation tool of claim 1, wherein the at least one object is a sectional view.

22. An instruction file used in a computer system for displaying multi-dimensional data, the instruction file comprising:

at least one two-dimensional page comprising at least one object associated with a three dimensional model and operable for manipulating a view of the three dimensional model; and a second object located about the at least one two-dimensional page functionally coupled to the at least one object associated with the three dimensional model;

the location, appearance and functionality of the at least two objects on the at least one two-dimensional page being user configurable and part of the resulting presentation or document and not part of a user interface;

the at least two objects incorporating the information and functionality for interpretation in either a creation tool or a viewer; and the at least two objects on the at least one two-dimensional page being associated with separate independent data sources.

23. The instruction file of claim 22, wherein the instruction file is interpretable such that manipulation of the at least one object associated with the three dimensional model results in a change in a visual characteristic of the second object.

24. The instruction file of claim 23, wherein the second object is a two dimensional image.

25. The instruction file of claim 23, wherein the at least one object associated with the three dimensional model is a first person walkthrough view of the three dimensional model and the second object is an orbital view of the three dimensional model.

26. The instruction file of claim 22, wherein the instruction file is interpretable such that manipulation of the second object results in a change in a visual characteristic of the at least one object associated with the three dimensional model.

27. The instruction file of claim 22, the instruction file further comprising: at least one user definable button located on the at least one page, the at least one button programmable to manipulate visual characteristics of objects.

28. The instruction file of claim 27, wherein the at least one user definable button is interpretable to manipulate a vantage point view of the three dimensional model.

29. The instruction file of claim 27, wherein the at least one user definable button is interpretable to manipulate an area of view of a two dimensional image.

30. The instruction file of claim 22, the instruction file further comprising at least one text object operable to superimpose text on other objects on the at least one two-dimensional page.

31. The instruction file of claim 30, wherein the instruction file is interpretable such that manipulations of the at least one object on the at least one two-dimensional page alter the visual characteristic of the text on the at least one two-dimensional page.

32. The instruction file of claim 22, the instruction file further comprising instructions for pan and zoom features for manipulating a two-dimensional object.

33. The instruction file of claim 22, wherein the at least one object is a user controlled walkthrough view with automatic detection of collisions with objects in the 3D scene.

34. The instruction file of claim 22, wherein the at least one object and the second object reference different data sources are synchronized using a transform matrix such that a location in one data source can be mapped to the corresponding location in the second data source.

35. The presentation tool of claim 22, wherein the at least one object is a sectional view.

36. The instruction file of claim 22, wherein one object has a three (3) dimensional data source and the other object has a two (2) dimensional data source.

* * * * *